United States Patent [19]

El Ayat et al.

[11] Patent Number: 5,698,992

[45] Date of Patent: *Dec. 16, 1997

[54] PROGRAMMABLE LOGIC MODULE AND ARCHITECTURE FOR FIELD PROGRAMMABLE GATE ARRAY DEVICE

[75] Inventors: Khaled A. El Ayat, Cupertino; Gregory W. Bakker, Sunnyvale; Jung-Cheun Lien, San Jose; William C. Plants, Santa Clara; Sinan Kaptanoglu, San Carlos; Runip Gopisetty, Los Gatos; King W. Chan, Los Altos; Marko Chew, Cupertino, all of Calif.

[73] Assignee: Actel Corporation, Sunnyvale, Calif.

[*] Notice: The term of this patent shall not extend beyond the expiration date of Pat. No. 5,477,165.

[21] Appl. No.: 746,554

[22] Filed: Nov. 13, 1996

Related U.S. Application Data

[63] Continuation of Ser. No. 522,945, Sep. 1, 1995, Pat. No. 5,606,267, which is a continuation of Ser. No. 332,550, Oct. 28, 1994, Pat. No. 5,477,165, which is a continuation-in-part of Ser. No. 246,218, May 19, 1994, Pat. No. 5,451,887, which is a continuation-in-part of Ser. No. 2,873, Jan. 13, 1993, Pat. No. 5,367,208, which is a continuation of Ser. No. 869,488, Apr. 15, 1992, Pat. No. 5,187,393, which is a continuation of Ser. No. 621,452, Jan. 15, 1991, Pat. No. 5,172,014, which is a division of Ser. No. 309,306, Feb. 10, 1989, Pat. No. 5,015,885, which is a continuation-in-part of Ser. No. 195,728, May 18, 1988, Pat. No. 4,873,459, which is a continuation-in-part of Ser. No. 909,261, Sep. 19, 1986, Pat. No. 4,758,745.

[51] Int. Cl.[6] .................................................. H03K 19/177
[52] U.S. Cl. .................................. 326/41; 326/39; 326/47
[58] Field of Search ................................ 326/34–41, 46–47

[56] References Cited

U.S. PATENT DOCUMENTS

| 3,619,583 | 11/1971 | Arnold | 235/152 |
|---|---|---|---|
| 3,731,073 | 5/1973 | Moylan | 235/152 |
| 3,816,725 | 6/1974 | Greer | 235/152 |
| 3,818,452 | 6/1974 | Greer | 340/166 |

(List continued on next page.)

FOREIGN PATENT DOCUMENTS

| 0 394 575 | 10/1990 | European Pat. Off. | H03K 19/177 |
|---|---|---|---|
| 0 515 043 | 11/1992 | European Pat. Off. | H03K 19/177 |
| 0 690 579 | 1/1996 | European Pat. Off. | H03K 19/173 |
| 57-111044 | 7/1982 | Japan | H01L 21/82 |
| 5-040804 | 11/1991 | Japan | G06F 15/60 |
| 6-506098 | 7/1994 | Japan | H03K 19/177 |
| 2 045 488 | 10/1980 | United Kingdom | H03K 19/20 |
| WO87/02827 | 5/1987 | WIPO | H01L 27/24 |

OTHER PUBLICATIONS

Akers, "A Rectangle Logic Array", Aug., 1972, IEEE Transaction on Computers, vol. C–21, No. 8, pp. 842–857.
Chen, "A Comparsion of Universal–Logic–Module Realizations and Their Application in the Synthesis of Combinatorial and Sequential Logic Networks", Feb. 1982, IEEE Transactions on Computers, vol. C–31, No. 2, pp. 140–147.
Greer, "An Associate Logic Matrix", Oct. 1976, IEEE, Journal of Solid–State Circuits, vol. SC–11, No. 5, pp. 679–691.

(List continued on next page.)

*Primary Examiner*—David R. Hudspeth
*Attorney, Agent, or Firm*—D'Alessandro & Ritchie

[57] ABSTRACT

A user-programmable gate array architecture includes an array of logic function modules which may comprise one or more combinatorial and/or sequential logic circuits. An interconnect architecture comprising a plurality of horizontal and vertical general interconnect channels, each including a plurality of interconnect conductors some of which may be segmented, is imposed on the array. Individual ones of the interconnect conductors are connectable to each other and to the inputs and outputs of the logic function modules by user-programmable interconnect elements. A local interconnect architecture comprising local interconnect channels is also imposed on the array. Each local interconnect channel includes a plurality of local interconnect conductors and runs between pairs of adjacent ones of the logic function modules.

31 Claims, 10 Drawing Sheets

U.S. PATENT DOCUMENTS

| | | | |
|---|---|---|---|
| 3,849,638 | 11/1974 | Greer | 235/152 |
| 3,912,914 | 10/1975 | Moylan | 235/152 |
| 3,987,287 | 10/1976 | Cox et al. | 235/152 |
| 4,267,463 | 5/1981 | Mayumi | 307/445 |
| 4,293,783 | 10/1981 | Patil | 307/465 |
| 4,293,919 | 10/1981 | Dasgupta et al. | 364/716 |
| 4,357,678 | 11/1982 | Davis | 364/900 |
| 4,366,393 | 12/1982 | Kasuya | 307/221 |
| 4,433,331 | 2/1984 | Kollaritsch | 340/825.83 |
| 4,453,096 | 6/1984 | Le Can et al. | 307/448 |
| 4,580,215 | 4/1986 | Morton | 364/200 |
| 4,600,846 | 7/1986 | Burrows | 307/465 |
| 4,613,970 | 9/1986 | Masuda et al. | 371/25 |
| 4,642,487 | 2/1987 | Carter | 326/41 |
| 4,677,318 | 6/1987 | Veenstra | 307/465 |
| 4,701,922 | 10/1987 | Kuboki et al. | 371/25 |
| 4,706,208 | 11/1987 | Helms | 364/580 |
| 4,706,216 | 11/1987 | Carter | 365/94 |
| 4,706,217 | 11/1987 | Shimizu et al. | 365/154 |
| 4,713,557 | 12/1987 | Carter | 307/242 |
| 4,717,912 | 1/1988 | Harvey et al. | 340/825.83 |
| 4,742,252 | 5/1988 | Agrawal | 307/465 |
| 4,758,745 | 7/1988 | Elgamal et al. | 307/465 |
| 4,758,985 | 7/1988 | Carter | 365/94 |
| 4,763,020 | 8/1988 | Takata et al. | 307/465 |
| 4,786,904 | 11/1988 | Graham, III et al. | 340/825.83 |
| 4,789,951 | 12/1988 | Birkner et al. | 364/716 |
| 4,821,176 | 4/1989 | Ward et al. | 364/200 |
| 4,825,105 | 4/1989 | Hölzle | 307/440 |
| 4,845,633 | 7/1989 | Furtek | 364/490 |
| 4,847,612 | 7/1989 | Kaplinsky | 340/825.8 |
| 4,847,732 | 7/1989 | Stopper et al. | 361/395 |
| 4,857,774 | 8/1989 | El-Ayat et al. | 307/465 |
| 4,870,300 | 9/1989 | Nakaya et al. | 307/303 |
| 4,870,302 | 9/1989 | Freeman | 307/465 |
| 4,871,930 | 10/1989 | Wong et al. | 307/465 |
| 4,873,459 | 10/1989 | El Gamal et al. | 307/465 |
| 4,903,223 | 2/1990 | Norman et al. | 364/716 |
| 4,910,417 | 3/1990 | El Gamal et al. | 307/465 |
| 4,912,342 | 3/1990 | Wong et al. | 307/465 |
| 4,963,768 | 10/1990 | Agrawal et al. | 307/465 |
| 4,963,770 | 10/1990 | Keida | 307/465 |
| 5,001,368 | 3/1991 | Cliff et al. | 307/465 |
| 5,003,200 | 3/1991 | Sakamoto | 307/465 |
| 5,015,885 | 5/1991 | El Gamal et al. | 307/465 |
| 5,019,736 | 5/1991 | Furtek | 307/465 |
| 5,023,606 | 6/1991 | Kaplinsky | 340/825.8 |
| 5,046,035 | 9/1991 | Jigour et al. | 364/716 |
| 5,055,718 | 10/1991 | Galbraith et al. | 307/465 |
| 5,073,729 | 12/1991 | Greene et al. | 307/465.1 |
| 5,083,083 | 1/1992 | El-Ayat et al. | 324/158 |
| 5,122,685 | 6/1992 | Chan et al. | 307/465.1 |
| 5,132,571 | 7/1992 | McCollum et al. | 307/465.1 |
| 5,140,193 | 8/1992 | Freeman et al. | 307/465 |
| 5,144,166 | 9/1992 | Camarota et al. | 307/465.1 |
| 5,151,623 | 9/1992 | Agrawal | 307/465 |
| 5,172,014 | 12/1992 | El Ayat et al. | 307/465 |
| 5,185,706 | 2/1993 | Agrawal et al. | 364/489 |
| 5,187,393 | 2/1993 | El Gamal et al. | 307/465.1 |
| 5,220,213 | 6/1993 | Chan et al. | 307/465 |
| 5,225,719 | 7/1993 | Agrawal et al. | 307/465 |
| 5,231,588 | 7/1993 | Agrawal et al. | 364/489 |
| 5,245,227 | 9/1993 | Furtek et al. | 307/465 |
| 5,258,668 | 11/1993 | Cliff et al. | 307/465 |
| 5,260,611 | 11/1993 | Cliff et al. | 307/465 |
| 5,270,587 | 12/1993 | Zagar | 307/469 |
| 5,280,202 | 1/1994 | Chan et al. | 307/465 |
| 5,291,079 | 3/1994 | Goetting | 307/465 |
| 5,302,866 | 4/1994 | Chiang et al. | 307/465 |
| 5,313,119 | 5/1994 | Cooke et al. | 307/465.1 |
| 5,331,226 | 7/1994 | Goetting | 307/465 |
| 5,338,983 | 8/1994 | Agarwala | 307/465 |
| 5,341,044 | 8/1994 | Ahanin et al. | 307/465 |
| 5,365,125 | 11/1994 | Goetting et al. | 326/39 |
| 5,386,154 | 1/1995 | Goetting et al. | 326/44 |
| 5,396,127 | 3/1995 | Chan et al. | 326/44 |
| 5,400,262 | 3/1995 | Mohsen | 364/489 |
| 5,416,367 | 5/1995 | Chan et al. | 326/44 |
| 5,430,390 | 7/1995 | Chan et al. | 326/38 |
| 5,440,245 | 8/1995 | Galbraith et al. | 326/38 |
| 5,442,246 | 8/1995 | Azegami et al. | 326/38 |
| 5,448,185 | 9/1995 | Kaptanoglu | 326/39 |
| 5,451,887 | 9/1995 | El-Ayat et al. | 326/39 |
| 5,457,409 | 10/1995 | Agrawal et al. | 326/39 |
| 5,465,055 | 11/1995 | Ahrens | 326/41 |
| 5,469,003 | 11/1995 | Kean | 326/39 |
| 5,477,165 | 12/1995 | El-Ayat et al. | 326/41 X |
| 5,481,206 | 1/1996 | New et al. | 326/38 |
| 5,483,178 | 1/1996 | Costello et al. | 326/41 |
| 5,489,857 | 2/1996 | Agrawal et al. | 326/41 |
| 5,500,608 | 3/1996 | Goetting et al. | 326/39 |
| 5,521,835 | 5/1996 | Trimberger | 364/489 |
| 5,523,963 | 6/1996 | Hsieh et al. | 364/786 |
| 5,537,341 | 7/1996 | Rose et al. | 364/579 |
| 5,541,530 | 7/1996 | Cliff et al. | 326/41 |
| 5,546,018 | 8/1996 | New et al. | 326/38 |
| 5,550,771 | 8/1996 | Hatori | 365/174 |
| 5,550,782 | 8/1996 | Cliff et al. | 365/230.03 |
| 5,552,721 | 9/1996 | Gould | 326/39 |
| 5,565,792 | 10/1996 | Chiang et al. | 326/40 |
| 5,570,041 | 10/1996 | El-Ayat et al. | 326/41 |
| 5,583,450 | 12/1996 | Trimberger et al. | 326/41 |
| 5,587,669 | 12/1996 | Chan et al. | 326/38 |
| 5,594,363 | 1/1997 | Freeman et al. | 326/39 |
| 5,594,364 | 1/1997 | Chan et al. | 326/39 |
| 5,594,657 | 1/1997 | Cantone et al. | 364/490 |
| 5,596,287 | 1/1997 | Cho | 326/40 |
| 5,600,263 | 2/1997 | Trimberger et al. | 326/39 |

OTHER PUBLICATIONS

Haines, "Field–Programmable Gate Array with Non–Volatile Configuration", Jun. 1989, Microprocessors and Microsystems, vol. 13, No. 5, pp. 305–312.

Hayes, "A Unified Switching Theory with Applications to VLSI Design", 1982, IEEE, vol. 70, No. 10, pp. 1140–1151.

Jigour, "PEEL Array Architectures Increase Logic Density, Flexibility and Performance", Nov. 1990, Wescon Conference Record, Los Angeles, pp. 316–321.

Jump, "Microprogrammed Arrays", Sep. 1972, IEEE Transactions on Computers, col. C–21, No. 9, pp. 974–984.

Jump, "Asynchronous Control Arrays", Oct. 1974, IEEE Transactions on Computers, vol. C–23, No. 10, pp. 1020–1029.

Kawana, "An Efficient Logic Block Interconnect Architecture for User–Reprogrammable Gate Array", 1990, IEEE Custom Integrated Circuits Conference, 31.3.1–31.3.4.

Minnick, "Cutpoint Cellular Logic", Dec. 1964, IEEE Transactions on Electronic Computers, pp. 685–698.

Rose, "The Effect of Logic Block Complexity on Area of Programmable Gate Arrays", 1989, IEEE Custom Integrated Circuits Conference, pp. 531–535.

Schuster, "Keine Angst vor FPGAs", 1993, 2087 Elektronik, 42, No. 11, Munchen, DE.

Yau, "Universal Logic Modules and Their Applications", 1970, IEEE Transactions on Computers, vol. C–19, No. 2, pp. 141–149.

| Signal Name: | A0 | B0 | A1 | B1 | L0 | L1 | L2 | L3 | D0 | D1 | D2 | D3 | Output Equation |
|---|---|---|---|---|---|---|---|---|---|---|---|---|---|
| Reference Num: | 56 | 58 | 72 | 74 | 78 | 80 | 82 | 84 | 48 | 50 | 60 | 62 | |
| Function | External | | | | | | | | Internal | | | | |
| AND4 | a | b | c | 0 | 0 | 0 | 0 | d | L0 | L1 | L2 | L3 | abcd |
| NAND4 | a | b | c | 0 | 0 | 1 | 1 | d | L0 | L1 | L2 | !L3 | !(abcd) |
| OR4 | a | 1 | b | c | 1 | 1 | 1 | d | L0 | L1 | L2 | L3 | a+b+c+d |
| NOR4 | a | 1 | b | c | d | 0 | 0 | d | !L3 | L0 | L1 | L2 | !(a+b+c+d) |
| XOR3 | a | 1 | b | 0 | 0 | 0 | 0 | c | L3 | !L3 | L3 | L3 | a!b!c+!ab!c+!a!bc+abc |
| XNOR3 | a | 1 | b | 0 | 0 | 0 | 0 | c | !L3 | L3 | L3 | !L3 | !(a!b!c+!ab!c+!a!bc+abc) |
| RS-Latch | !r | 1 | s | 0 | 0 | 0 | q | 1 | L0 | L1 | L2 | L3 | q |
| D-Latch | e | 1 | 1 | 1 | 0 | q | q | d | L0 | L1 | L2 | L3 | q |
| D-Latch w/Res | e | 1 | !r | 0 | 0 | 0 | q | d | L0 | L1 | L2 | L3 | q |
| 2-bit Sum | a0 | b0 | a1 | 0 | 0 | 1 | 0 | b1 | L3 | !L3 | !L3 | L1 | (a0b0)!a1!b1+!(a0b0)a1!b1+!(a0b0)!a1b1+(a0b0)a1b1 |
| 2-bit Carry | a0 | b0 | a1 | 0 | 0 | 0 | 0 | b1 | L0 | L3 | L3 | L3 | (a0b0)a1+(a0b0)b1+a1b1 |
| 4:1 Mux | s0 | 1 | s1 | 0 | d0 | d1 | d2 | d3 | L0 | L1 | L2 | L3 | d0!s1!s0+d1!s1s0+d2s1!s0+d3s1s0 |

FIG. 2B

PROGRAMMABLE LOGIC MODULE AND ARCHITECTURE FOR FIELD PROGRAMMABLE GATE ARRAY DEVICE

RELATED APPLICATION DATA

This is a continuation of patent application Ser. No. 08/522,945, filed Aug. 1, 1995, now U.S. Pat. No. 5,606,267, which is a continuation of patent application Ser. No. 08/332,550, filed Oct. 28, 1994, now U.S. Pat. No. 5,477,165, which is a continuation-in-part of patent application Ser. No. 08/246,218, filed May 19, 1994, now U.S. Pat. No. 5,451,887, which is a continuation-in-part of patent application Ser. No. 08/002,873, filed Jan. 13, 1993, now U.S. Pat. No. 5,367,208, which is a continuation of patent application Ser. No. 07/869,488, filed Apr. 15, 1992, now U.S. Pat. No. 5,187,393, which is a continuation of patent application Ser. No. 07/621,452, filed Jan. 15, 1991, now U.S. Pat. No. 5,172,014, which is a division of patent application Ser. No. 07/309,306, filed Feb. 10, 1989, now U.S. Pat. No. 5,015,885, which is a continuation-in-part of patent application Ser. No. 07/195,728, filed May 18, 1988, now U.S. Pat. No. 4,873,459, which is a continuation-in-part of patent application Ser. No. 06/909,261, filed Sep. 19, 1986, now U.S. Pat. No. 4,758,745.

BACKGROUND OF THE INVENTION

1. Field of the Invention

The present invention relates to programmable integrated circuits. More particularly, the present invention relates to a programmable logic module and architecture for use in integrated circuits such as field programmable gate array integrated circuits.

2. The Prior Art

Recent advances in user-programmable interconnect technology have resulted in the development of field programmable gate array (FPGA) integrated circuits which may be customized by a user to perform a wide variety of combinational and sequential logic functions. Numerous architectures for such integrated circuits are known. Examples of such architectures are found disclosed in U.S. Pat. Nos. 4,870,302 to Freeman, 4,758,745 to El Gamal et al., and 5,132,571 to McCollum et al. The architecture employed in a particular FPGA integrated circuit will determine the richness and the density of the possible interconnections which can be made among the various circuit elements disposed on the integrated circuit and thus can profoundly affect its usefulness.

Programmable logic blocks which are capable of performing a selectable one of a plurality of user-selectable logic functions are known in the prior art and are employed in FPGA architectures such as the ones cited above. U.S. Pat. No. 4,910,417 to El Gamal et al., assigned to the same assignee as the present invention, U.S. Pat. Nos. 5,055,718 and 5,198,705 to Galbraith et al., and U.S. Pat. No. 4,453,096 to Le Can et al., disclose logic modules composed of multiplexers capable of performing a plurality of combinatorial functions. U.S. Pat. No. 4,541,067 to Whittaker discloses how to perform different logic functions using different combinations of pass transistors.

While these circuits provide a degree of flexibility to the designer of user-programmable logic arrays, there is always a need for improvement of functionality of such circuits.

BRIEF DESCRIPTION OF THE INVENTION

The present invention relates to FPGA architectures, and more specifically to the core architecture of an FPGA integrated circuit including the functional circuit modules, sometimes referred to as programmable logic modules, and the interconnect architecture which is used to define the functions of the programmable logic modules as well as the interconnections between them.

A user-programmable gate array architecture according to the present invention includes an array of logic function modules which may comprise one or more combinatorial and/or sequential logic circuits. An interconnect architecture comprising a plurality of horizontal and vertical general interconnect channels, each including a plurality of interconnect conductors some of which may be segmented, is imposed on the array array. Individual ones of the interconnect conductors are connectable to each other and to the inputs and outputs of the logic function modules by user-programmable interconnect elements. A local interconnect architecture comprising local interconnect channels is also imposed on the array. Each local interconnect channel includes a plurality of local interconnect conductors and runs between two or more adjacent ones of the logic function modules.

A programmable logic module according to a presently preferred embodiment of the present invention comprises three function units. Each of the three functional units may be selected from among at least a combinatorial unit and a sequential unit.

According to a presently preferred embodiment, the combinatorial unit for the programmable logic module may comprise three multiplexers. A first two input multiplexer has a first data input connected to a first data input node, a second data input connected to a second data input node, a control input connected to the output of a first gate, and an output. The first gate has a first input connected to a first control input node and a second input connected to a second control input node. A second two input multiplexer has a first data input connected to a third data input node, a second data input connected to a fourth data input node, a control input connected to the output of the first gate, and an output. A plurality of interconnect conductors intersect the first through fourth data input nodes and a user-programmable interconnect element is preferably disposed at each intersection to allow programmable connections to be made between selected ones of the interconnect conductors and selected ones of the first through fourth data input nodes. One of the plurality of interconnect conductors is connected to another one of the interconnect conductors through an inverter.

A third two input multiplexer has a first data input connected to the output of the first multiplexer, a second data input connected to the output of the second multiplexer, a control input connected to the output of a second gate, and an output. The output is preferably buffered. The second gate has a first input connected to a third control input node and a second input connected to a fourth control input node.

According to a presently preferred embodiment of the invention, the sequential unit comprises three multiplexers and a D flip-flop, although other sequential logic circuits will also be usable. A first two input multiplexer has a first data input connected to a first data input node, a second data input connected to a second data input node, a control input connected to a first control node, and an output. A second two input multiplexer has a first data input connected to the output of the first multiplexer, a second data input connected to the output of the D flip-flop, a control input connected to a second control node, and an output connected to the D input of the D flip-flop. A first four input multiplexer has a first data input connected to a first clock input node, a second data input connected to the complement of the signal on the first data input node, a third data input connected to a second clock input node, a fourth data input connected to the complement of the signal on the second clock input node, first control input connected to a clock select node and a second control input connected to a clock polarity select node, and an output connected to the clock input of the D flip-flop.

According to another aspect of the invention, the combinatorial unit for the programmable logic module may comprise a cascaded multiplexer architecture having a plurality of multiplexer planes, each of the multiplexer planes including at least one multiplexer having inputs, at least one control input connected to at least one input node and at least one output. At least one multiplexer in a first of the multiplexer planes has inputs connected to input nodes and the inputs of at least one multiplexer in the multiplexer planes succeeding the first multiplexer plane is connected to the outputs of at least one multiplexer in the preceding multiplexer planes in the cascaded multiplexer architecture. At least one multiplexer in a last of the multiplexer planes has at least one output connected to an output conductor which is preferably buffered. At least one inverter has its input connected to an input node and its output selectively connectable to individual ones of the input nodes by user-programmable interconnect elements. The general cascaded multiplexer architecture for the combinatorial unit is more specifically described in various aspects of the invention set forth below.

According to another aspect of the invention, the combinatorial unit for the programmable logic module may comprise a multiplexer having a plurality of inputs connected to input nodes, at least one control input connected to an input node, and an output connected to an output conductor which is preferably buffered. An inverter has its input connected to an interconnect conductor and its output selectively connectable to individual ones of the input nodes of the multiplexer by user-programmable interconnect elements.

According to another aspect of the invention, the combinatorial unit for the programmable logic module may comprise a single two-input multiplexer. First two-input multiplexer has a first data input connected to a first data input node, a second data input connected to a second data input node, a control input connected to a control input node, and an output connected to an output buffer. An inverter has its input connected to an inverter input node and its output connected to inverter output node which intersects first and second data input nodes. First and second data input nodes and the inverter input intersect horizontal interconnect conductors in a general interconnect channel and a user-programmable interconnect element is preferably disposed at each intersection to allow programmable connections to be made between selected ones of the horizontal interconnect conductors and the inverter output nodes and selected ones of the first and second data input nodes.

According to another aspect of the invention, the combinatorial unit for the programmable logic module may comprise three two-input multiplexers. First two-input multiplexer has a first data input connected to a first data input node, a second data input connected to a second data input node, a control input connected to the output of a first gate, and an output. The first gate has a first input connected to a first control input node and a second input connected to a second control input node. Second two-input multiplexer has a first data input connected to a third data input node, a second data input connected to a fourth data input node, a control input connected to the output of the first gate, and an output. Third two-input multiplexer has a first data input connected to the output of first two-input multiplexer, a second data input connected to the output of second two-input multiplexer, a control input connected to the output of a second gate, and an output connected to an output buffer. The second gate has a first input connected to a third control input node and a second input connected to a fourth control input node. An inverter has its input connected to an inverter input node and its output connected to inverter output node which intersects first through fourth data input nodes.

First through fourth data input nodes, first through fourth control input nodes and the inverter input node intersect horizontal interconnect conductors in a general interconnect channel and a user-programmable interconnect element is preferably disposed at each intersection to allow programmable connections to be made between selected ones of the horizontal interconnect conductors and the inverter input node and selected ones of the first through fourth data input nodes and first through fourth control input nodes.

According to another aspect of the invention, the combinatorial unit for the programmable logic module may comprise three two-input multiplexers and two two-input control multiplexers. First two-input multiplexer has a first data input connected to a first data input node, a second data input connected to a second data input node, a control input connected to the output of a first two-input control multiplexer and an output. Second two-input multiplexer has a first data input connected to a third data input node, a second data input connected to a fourth data input node, a control input connected to the output of first two-input control multiplexer and an output. The first two-input control multiplexer has an input connected to a first input control node, an inverting input connected to a second input control node and a control input connected to a first input control multiplexer node. Third two-input multiplexer has a first data input connected to the output of first two-input multiplexer, a second data input connected to the output of second two-input multiplexer, a control input connected to the output of second two-input control multiplexer and an output connected to an output buffer. The second two-input control multiplexer has an inverting input connected to a third input control node, an input connected to a fourth input control node and a control input connected to a second input control multiplexer node.

First through fourth data input nodes, first through fourth input control nodes and first and second input control multiplexer nodes intersect horizontal interconnect conductors in a general interconnect channel and a user programmable interconnect element is preferably disposed at each intersection to allow programmable connections to be made between selected ones of the horizontal interconnect conductors and selected ones of the first through fourth data input nodes, first through fourth input control nodes and first and second input control multiplexer nodes.

According to another aspect of the invention, the combinatorial unit for the programmable logic module may comprise seven two-input multiplexers. First through fourth two-input multiplexers each have first and second data inputs connected respectively to first through eighth data inputs nodes, have outputs and each have a control input connected to first input control node. Fifth and sixth two-input multiplexers each have first and second data inputs connected respectively to the outputs of first through fourth two-input multiplexers, have outputs, and have a control input connected to the output of a first gate. The first gate has a first input connected to a second control input node and a second input connected to a third control input node. Seventh two-input multiplexer has a first data input connected to the output of fifth two-input multiplexer, a second data input connected to the output of sixth two-input multiplexer, a control input connected to the output of a second gate, and an output connected to an output buffer. The second gate has a first input connected to a fourth control input node and a second input connected to a fifth control input node.

A plurality of interconnect conductors intersect the first through eighth data input nodes and a user-programmable interconnect element is preferably disposed at each intersection to allow programmable connections to be made between selected ones of the interconnect conductors and selected ones of the first through eighth data input nodes. One of the plurality of interconnect conductors is connected to another one of the interconnect conductors through an inverter. Ones of the plurality of interconnect conductors and the first through fifth control inputs intersect horizontal interconnect conductors in a general interconnect channel and a user-programmable interconnect elements is preferably disposed at each intersection to allow programmable connections to be made between selected ones of the interconnect conductors and selected ones of the first through fifth control inputs.

According to another aspect of the invention, the combinatorial unit for the programmable logic module may comprise eight two-input multiplexers. First through fourth two-input multiplexers each has first and second data inputs connected respectively to first through eighth data inputs nodes, has outputs and each has a control input connected to first input control node. Fifth and sixth two-input multiplexers each has first and second data inputs connected respectively to the outputs of first through fourth two-input multiplexers, has outputs and each has a control input connected to the output of a first gate. The first gate has a first input connected to a second control input node and a second input connected to a third control input node. Seventh two-input multiplexer has a first data input connected to the output of fifth two-input multiplexer, a second data input connected to the output of sixth two-input multiplexer, a control input connected to the output of a second gate, and an output. The second gate has a first input connected to a fourth control input node and a second input connected to a fifth control input node. Eighth two-input multiplexer has first and second data inputs connected to ninth and tenth data input nodes, a control input connected to the output of seventh two-bit multiplexer, and an output connected to an output buffer.

A plurality of interconnect conductors intersect the first through tenth data input nodes and a user-programmable interconnect element is preferably disposed at each intersection to allow programmable connections to be made between selected ones of the interconnect conductors and selected ones of the first through fourth data input nodes. First and second inverters connect one of the plurality of interconnect conductors another of one of the plurality of interconnect conductors. Ones of the plurality of interconnect conductors and the first through fifth control inputs intersect horizontal interconnect conductors in a general interconnect channel and a user-programmable interconnect element is preferably disposed at each intersection to allow programmable connections to be made between selected ones of the plurality of interconnect conductors and selected ones of the first through fifth control inputs.

As previously noted, it is presently preferred to combine three functional units into a logic module. These three units may be identical, i.e., the logic module may comprise three combinatorial units or three sequential units, or may be mixed, i.e., the logic module may comprise one combinatorial unit and two sequential units. In logic modules containing mixtures of combinatorial units and sequential units, it may be advantageous to internally connect the prebuffered output of the combinatorial unit to one of the inputs of the first multiplexer of the sequential unit.

In a logic module architecture according to the present invention, two or more logic modules as previously described may be combined with a plurality of local interconnect conductors as previously described. According to a presently preferred embodiment of the invention, the local interconnect conductors are associated with a pair of logic modules. The outputs of the six functional units comprising the pair of logic modules are individually hardwired to different ones of the local interconnect conductors.

Selected ones of the inputs of the six function units comprising the two logic modules are programmably connectable to selected ones of the local interconnect conductors. The interconnect conductors Which intersect the input nodes of the multiplexers of the combinatorial units also intersect the local interconnect conductors. user-programmable interconnect elements are disposed at the intersections of the interconnect conductors and the local interconnect conductors to allow selective programmable interconnections to be made therebetween.

In addition, at least one of the inputs of at least one of the first and second gates in the combinatorial units intersects the local interconnect conductors and may be programmably connected to individual ones thereof by user-programmable interconnect elements.

In a presently contemplated embodiment of the invention, an array of logic module pairs according to the present invention is disposed on an integrated circuit. An architecture of interconnect conductors is superimposed on the logic modules. According to a presently preferred embodiment of the invention, groups of general interconnect conductors run in both a horizontal and a vertical direction in proximity to the logic modules. As is known in the prior art, these general interconnect conductors may be segmented by user-programmable interconnect elements. User programmable interconnect elements may be disposed at selected intersections of the horizontal and vertical general interconnect conductors and at the intersections of the vertical general interconnect conductors and the local interconnect conductors. The general interconnect conductors are programmably connected to the data input nodes, control input nodes, and output nodes of the functional units in the logic modules.

BRIEF DESCRIPTION OF THE DRAWINGS

FIG. 2B is a table showing the output states of the combinatorial functional unit of FIG. 2A as a function of the states of the inputs.

DETAILED DESCRIPTION OF A PREFERRED EMBODIMENT

Those of ordinary skill in the ad will realize that the following description of the present invention is illustrative only and not in any way limiting. Other embodiments of the invention will readily suggest themselves to such skilled persons.

Figure 1:
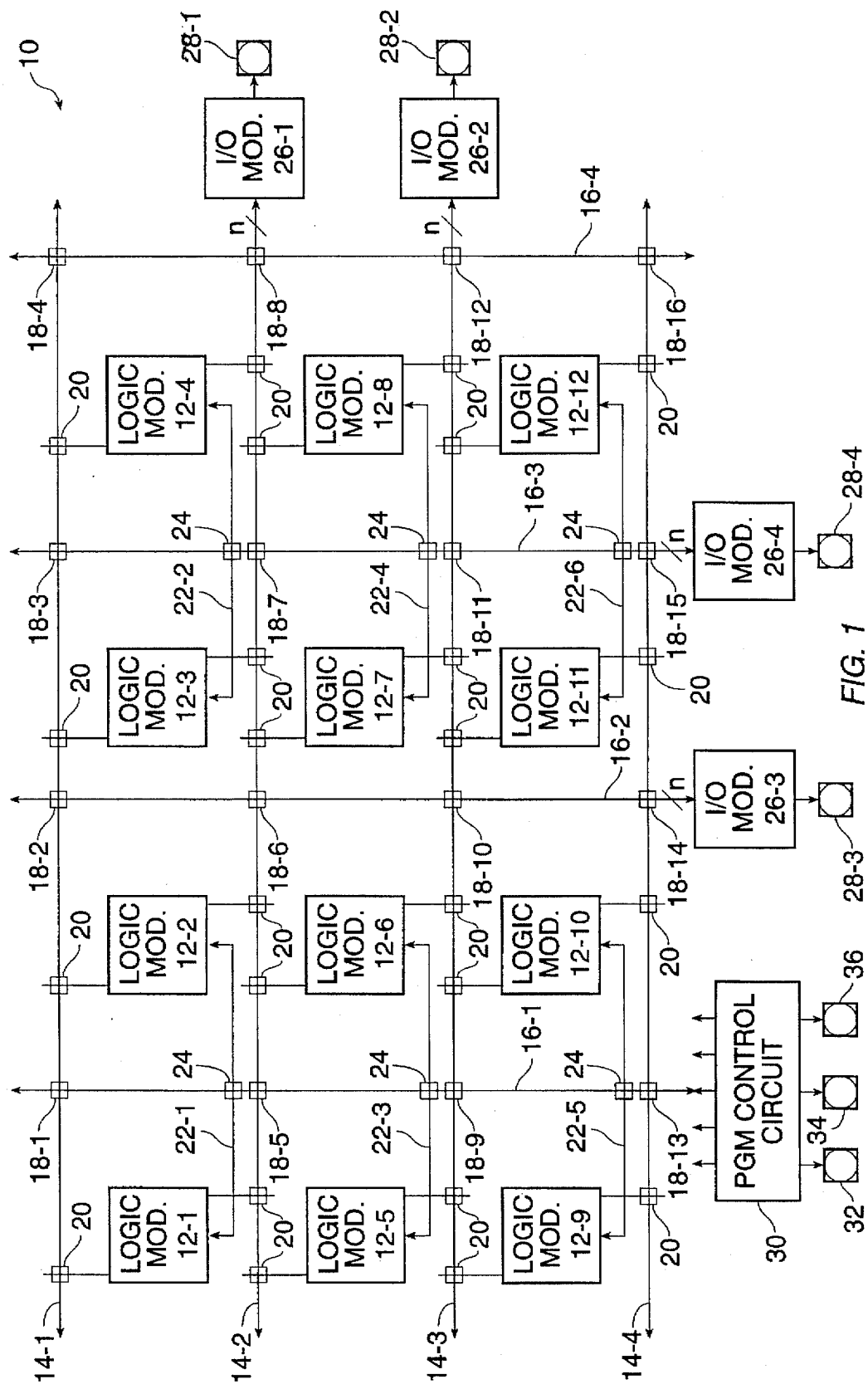
FIG. 1 is a simplified block diagram of a core architecture according to the present invention which may be employed in an FPGA integrated circuit.

Referring first to FIG. 1, a simplified block diagram of an FPGA core architecture 10 according to the present invention is shown. As used herein the term "core architecture" refers to the architecture of the core of an FPGA array which comprises a plurality of logic function circuits or modules (reference numerals 12-1 to 12-12) arranged in a matrix with an overlay of interconnect architecture including interconnect conductors and user-programmable interconnect elements. The logic function modules 12-1 through 12-12 may comprise any of a variety of circuits, either combinational logic, sequential logic, or combinations thereof, and need not be identical, as will be disclosed in more detail herein with respect to a presently preferred embodiment of the invention.

As shown in FIG. 1, logic function modules 12-1 through 12-12 are disposed in a network of interconnect conductors. In order to avoid over complicating the figure and rendering it more difficult to comprehend, those of ordinary skill in the art will recognize that the network of interconnect conductors is shown in simplified schematic form. In addition, while the drawing shows the interconnect conductors running between the logic function circuits, those of ordinary skill in the art will readily recognize that the architecture may be a "sea of gates" type architecture where the interconnect conductors actually run directly over, rather than between, the logic function circuits. In virtually all cases, the interconnect conductors will comprise metal lines in layers disposed over the layers which constitute the logic function circuits.

Such a "sea of gates" architecture is known in the art and is exemplified by U.S. Pat. No. 5,132,571 to McCollum et al. and permits the fabrication of a more dense array than an architecture in which the interconnect conductors run only between the logic function circuits. While such a "sea of gates" arrangement is preferred, those of ordinary skill in the art will recognize that the principles of the present invention apply equally to both types of architectures as well as hybrid architectures having interconnect conductors both directly above and between the logic function circuits.

FIG. 1 depicts an interconnect architecture comprising a plurality of horizontal and vertical channels of interconnect conductors. For simplicity, horizontal channels are depicted as single lines identified by reference numerals 14-1, 14-2, 14-3, and 14-4, and vertical channels are depicted as single lines identified by reference numerals 16-1, 16-2, 16-3, and 16-4. Those of ordinary skill in the art will appreciate that each channel will comprise a plurality of individual interconnect conductors, some of which may be segmented and some of which may run the length (or width) of the array. The number of interconnect conductors present in each channel in any actual integrated circuit which embodies the present invention will be dictated by individual design choice, based upon such factors as array size and density.

The segmentation of interconnect conductors is known and is exemplified in prior art patents such as U.S. Pat. Nos. 4,758,745 to El Gamal et al. and 5,073,729 to Greene et al. and is thus not shown in FIG. 1 to avoid over complicating the figure. As will be appreciated by those of ordinary skill in the art, any one of the many available segmentation schemes may be employed in the architecture of the present invention. Such skilled persons will recognize that the segmented interconnect conductors may be selectively joined to make longer conductors by programming user-programmable interconnect elements between selected ones of the conductors.

In order to provide for a rich potential of interconnection choices, the intersections of selected ones of the individual conductors horizontal and vertical interconnect channels are populated with user programmable interconnect elements which may be programmed by the user to make electrical connections between selected ones of them to implement connection nets between the inputs and the outputs of the logic function circuits. Groups of such user programmable interconnect elements at the intersections of the horizontal and vertical interconnect channels are shown schematically in FIG. 1 as squares 18-1 through 18-16. Inputs and outputs of the logic function circuits are also connectable to selected ones of the interconnect conductors in the channels by user-programmable interconnect elements disposed at the intersections of the individual inputs and outputs and selected ones of the interconnect conductors in the channels, as shown schematically by squares 20.

There are a number of available user-programmable interconnect technologies which may be employed in the architecture of the present invention. These include such elements as antifuses and active devices, such as pass transistors. Such devices, their implementation, and the circuitry necessary to program them, are well known to those of ordinary skill in the art. The details of these known devices will not be set forth herein to avoid over complicating the disclosure and thus obscuring the nature of the present invention. For convenience, the present disclosure will employ antifuse elements as exemplary user-programmable interconnect elements, but those of ordinary skill in the art will recognize that the present invention is not limited thereto and is intended to encompass pass transistors and other known devices which are user-programmable element equivalents of antifuses.

An important feature of the present invention is a network of "local interconnect" channels which are shown running between adjacent pairs of logic function circuits in the matrix. In FIG. 1, these local interconnect channels are shown running between 12-1 and 12-2, 12-3 and 12-4, 12-5 and 12-6, 12-7 and 12-8, 12-9 and 12-10, 12-11 and 12-22, and are indicated by reference numerals 22-1 through 22-6. As will be disclosed in more detail herein, the local interconnect channels provide an enhanced interconnection capability between neighboring logic function circuits. Those of ordinary skill in the art will recognize that the local interconnect channels may connect more than a single pair of adjacent logic modules. As a non-limiting example, local interconnect channel 22-1 could also be used in conjunction with the general interconnect channels to make connections to logic modules 12-5 and 12-6 as will be seen more clearly from FIG. 2A.

According to a presently preferred embodiment of the invention, selected ones of the individual local interconnect conductors are connectable to selected ones of the interconnect conductors in the channels by user-programmable interconnect elements placed at intersections thereof. The networks of these user-programmable interconnect elements are shown schematically in FIG. 1 as squares 24.

The core architecture of FPGA 10 communicates off chip by means of a plurality of input/output (I/O) modules. Illustrative I/O modules 26-1, 26-2, 26-3, and 26-4 are shown coupled between I/O pads 28-1, 28-2, 28-3, and 28-4, respectively, and horizontal interconnect channels 14-2 and 14-3 and vertical interconnect channels 16-2 and 16-3 respectively. As will be appreciated by those of ordinary skill in the art, I/O modules 26-1, 26-2, 26-3, and 26-4 each comprise an input buffer, an output buffer and input/output function select circuitry. The design of particular I/O module circuitry is simply a matter of design choice and is well within the level of ordinary skill in the art. Known examples of such circuitry may be found in U.S. Pat. No. 5,083,083.

Programming of the FPGA 10 of the present invention is controlled by program and test control circuit 30. Program and test control circuit 30 contains the necessary circuitry to accept programming data and control signals from off chip via I/O pads 32, 34, and 36. Those of ordinary skill in the art will recognize that the number of such I/O pads necessary for any actual implementation of the present invention will vary according to design choice and requirements. The data and control signals are used to program selected ones of the user-programmable interconnect elements in the integrated circuit in order to define the circuit functions of the logic function modules 21-1 through 12-12 and the I/O modules 26-1 through 26-4 and the circuit connection paths between them. Program and test control circuit 30 may also be used to provide test data to and obtain test data from the logic function modules 12-1 through 12-12 as known in the art. Examples of testing using such circuitry are found in U.S. Pat. Nos. 4,758,745 and 5,083,083.

Figure 2A:
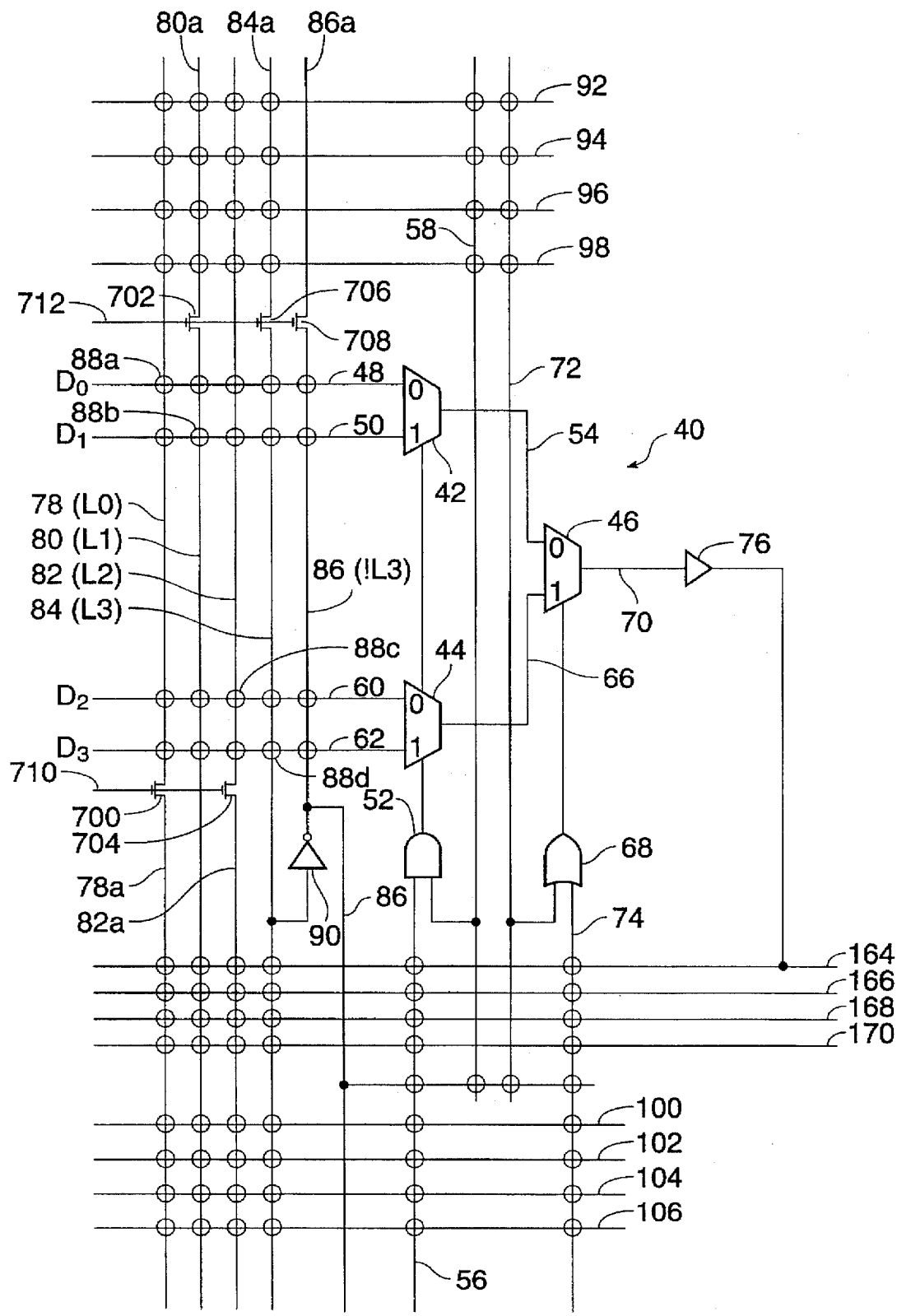
FIG. 2A is a block/schematic diagram of a presently preferred combinational functional unit according to the present invention, showing a portion of the interconnection architecture of the present invention.

As previously disclosed, the individual logic module circuits used in the present invention may comprise combinatorial logic units, sequential logic units, or combinations of one or both kinds of logic units. Referring now to FIG. 2A, a schematic/block diagram, a presently preferred embodiment of combinatorial unit 40 for the programmable logic module may comprise three two-input multiplexers 42, 44, and 46. First two-input multiplexer 42 has a first data input connected to a first data input node 48, a second data input connected to a second data input node 50, a control input connected to the output of a first gate 52, and an output 54. The first gate 52 has a first input connected to a first control input node 56 and a second input connected to a second control input node 58. Second two-input multiplexer 44 has a first data input connected to a third data input node 60, a second data input connected to a fourth data input node 62, a control input connected to the output of the first gate 52, and an output 66. Third two-input multiplexer 46 has a first data input connected to the output 54 of first multiplexer 42, a second data input connected to the output 66 of second multiplexer 44, a control input connected to the output of a second gate 68, and an output 70. The second gate 68 has a first input connected to a third control input node 72 and a second input connected to a fourth control input node 74. An output buffer 76 is connected to the output 70 of third multiplexer 46. First gate 52 and second gate 68 are shown as an AND and an OR gate, respectively, but persons of ordinary skill in the art will recognize that other gate combinations are possible.

Those of ordinary skill in the art will recognize that several different technologies may be employed to implement a multiplexer structure contemplated herein and that the specific technology chosen will vary according to design choice and circuit requirements. These various implementations include, but are not limited to, pass transistors, logic gates and bipolar transistors. The details of these known devices will not be set forth herein to avoid over complicating the disclosure and thus obscuring the nature of the present invention.

A plurality of interconnect conductors 78, 80, 82, 84, and 86 intersect the first through fourth data input nodes 48, 50, 60 and 62 and user-programmable interconnect elements (shown as hollow circles in the drawing figures) are preferably disposed at each intersection to allow programmable connections to be made between selected ones of the interconnect conductors and selected ones of the first through fourth data input nodes. Selected ones of the user-programmable interconnect elements are indicated by reference numerals 88a–88d and will be discussed later with reference to FIG. 2B.

One of the plurality of interconnect conductors 86 is connected to another one of the interconnect conductors 84 through an inverter 90. As will be appreciated by those of ordinary skill in the art, the presence of inverter 90 adds to the versatility of the logic function module circuits by allowing a selected ones of the data inputs to be inverted. This versatility could be further increased by extending interconnect conductor 86 to cross other functional unit inputs in the same functional unit or by making it a part of the local interconnect channel to allow connections to other functional units. The output of inverter 90 can also be connected to any of the inputs of gates 52 and 68 through additional antifuses.

As may also be seen from FIG. 2A, the interconnect conductors 78, 80, 82, and 84 are shown intersecting horizontal interconnect conductors 92, 94, 96, and 98 in an upper general interconnect channel and horizontal interconnect conductors 100, 102, 104, and 106 in a lower general interconnect channel. The control input nodes 56, 58, 72, and 74 of the first and second gates 52 and 68 also cross the horizontal interconnect conductors 92, 94, 96, 98, 100, 102, 104, and 106. Other user-programmable interconnect elements are disposed at the intersections of these conductors and may be programmed to selectively make connections as is known in the art.

Those of ordinary skill in the art will recognize that the particular arrangement depicted in FIG. 2A is merely illustrative and that other arrangements using other numbers of interconnect conductors and other schemes for populating the conductor intersections with user-programmable interconnect elements are possible.

The combinatorial unit 40 for the programmable logic module depicted in FIG. 2A is a compact and flexible circuit, capable of performing a wide variety of combinatorial logic functions. Referring now to FIG. 2B, a table is presented showing the output states of the combinatorial logic function module block of FIG. 2A as a function of the states of its inputs for a small sampling of the available combinatorial functions possible using this unit. Those of ordinary skill in the art will be readily able to determine the remaining possible functions. Such skilled persons will also readily recognize that multiple implementations are possible for certain of these functions. In reading the Table of FIG. 2B, A0 and B0 represent the first and second control inputs 56 and 58 of AND Gate 52, A1 and B1 represent the first and second control inputs 72 and 74 of OR Gate 68. The input lines L0, L1, L2, and L3 represent interconnect conductors 78, 80, 82, and 84, respectively. The inputs D0, D1, D2, and D3 represent the data input nodes 48, 50, 60 and 62, respectively, of the first and second multiplexers 42 and 44. Finally, the notation IL3 in the entries under "Internal" represent the output of inverter 90 on interconnect conductor 86. By reading the entries under L0, L1, L2, and L3 together with the entries under D0, D1, D2, and D3, those of ordinary skill in the art can readily determine which user-programmable interconnect elements to program to implement the desired logic function.

The entries in FIG. 2B are straightforward. As an example, to configure the programmable logic module depicted in FIG. 2A as a four-input AND Gate, the following connections are made. The input terms "a" and "b" are presented to the first and second inputs of AND gate 52 on lines 56 and 58. The input term "c" is presented to one of the inputs 72 of OR gate 68 and a logic "0" is presented to the other input 74 of OR gate 68. Logic "0" levels are presented to interconnect conductors 78, 80, and 82, and the input term "d" is presented to interconnect conductor 84.

By examining the entries in the first line of the table of FIG. 2B it is seen that D0 (first data input node 48 to first input of first multiplexer 42) is connected to interconnect conductor 78. This may be accomplished by programming user-programmable interconnect element 88a at the intersection of interconnect conductor 78 and first data input node 48. Similarly, D1 (second data input node 50 to second input of first multiplexer 42) is connected to interconnect conductor 80. This may be accomplished by programming user-programmable interconnect element 88b at the intersection of interconnect conductor 80 and second data input node 50. similarly, D2 (third data input node 60 to first input node 60 to first input of second multiplexer 44) is connected to interconnect conductor 82. This may be accomplished by programming user-programmable interconnect element 88c at the intersection of interconnect conductor 82 and third data input node 60. Similarly, D3 (fourth data input node 62 to second input of second multiplexer 44) is connected to the input term "d" on interconnect conductor 84. This connection is made by programming user-programmable interconnect element 88d at the intersection of interconnect conductor 84 and fourth data input node 62.

Figure 2C:
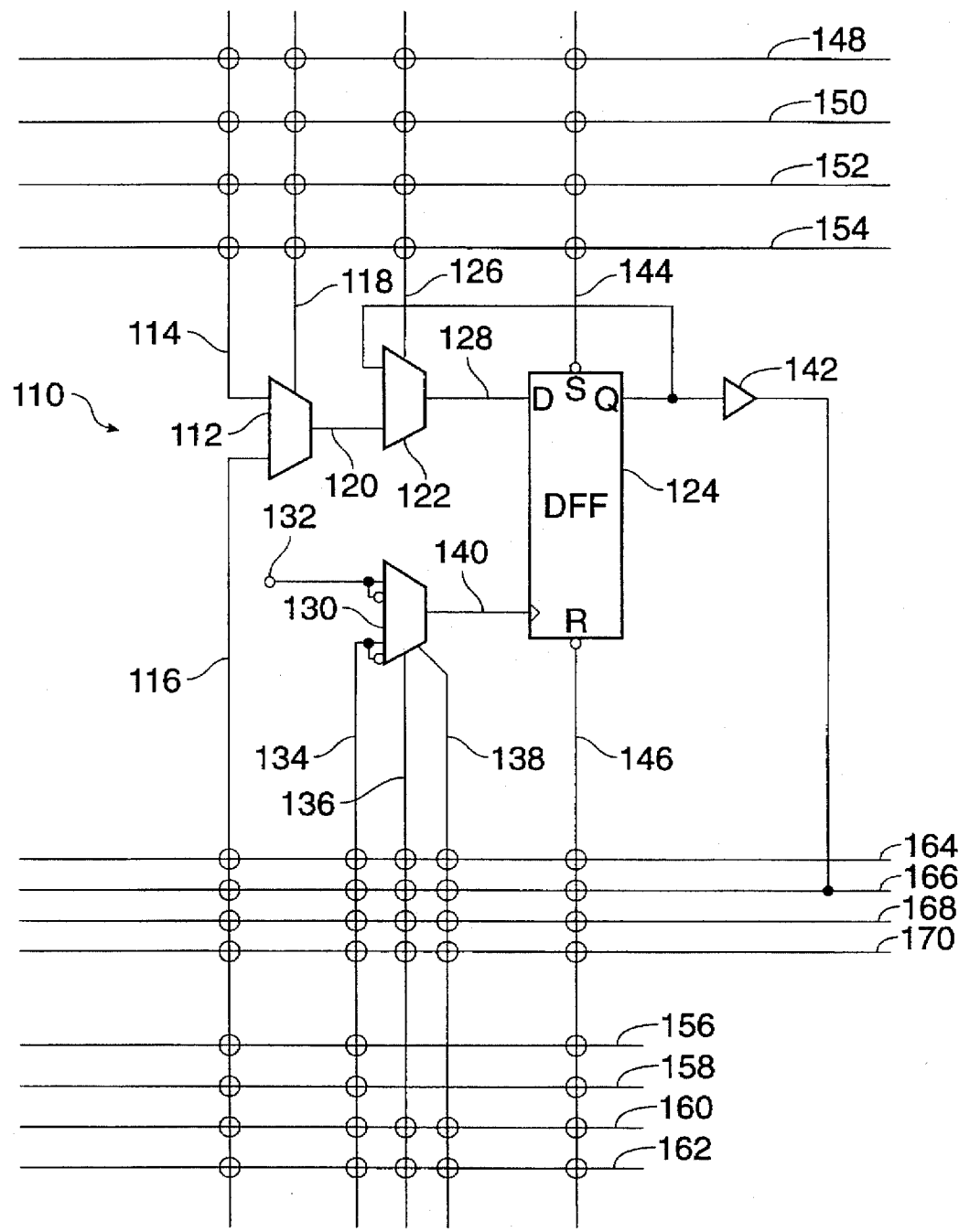
FIG. 2C is a block/schematic diagram of a presently preferred sequential functional unit according to the present invention, showing a portion of the interconnection architecture of the present invention.

Referring now to FIG. 2C, a presently preferred embodiment of a sequential logic unit 110 for a logic module according to the present invention is shown in block/schematic format. According to a presently preferred embodiment of the invention, the sequential logic unit comprises three multiplexers and a D flip-flop. A first two-input multiplexer 112 has a first data input connected to a first data input node 114, a second data input connected to a second data input node 116, a control input connected to a first control node 118, and an output 120. A second two-input multiplexer 122 has a first data input connected to the output 120 of the first multiplexer, a second data input connected to the output of D flip-flop 124, a control input connected to a second control node 126, and an output 128 connected to the D input of the D flip-flop 124. A first four-input multiplexer 130 has a first data input connected to a first clock input node 132, a second data input connected to the complement of the signal on first clock input node 132, a third data input connected to a second clock input at node 134, a fourth data input connected to the complement of the second clock input signal on node 134, a first control input connected to a clock select node 136, a second control input connected to a clock polarity select node 138, and an output 140 connected to the clock input of the D flip-flop 124. The output of D flip-flop 124 is buffered by buffer 142.

Finally, D flip-flop 124 is also provided with set and reset inputs connected to set and reset nodes 144 and 146, respectively.

As with the combinatorial unit 40 of FIG. 2A, sequential unit 110 of FIG. 2C is connectable to the interconnect architecture of the present invention. As may also be seen from FIG. 2C, the various inputs and control inputs of the elements of sequential unit 110 are shown intersecting horizontal interconnect conductors 148, 150, 152, and 154, in an upper general interconnect channel and horizontal interconnect conductors 156, 158, 160, and 162 in a lower general interconnect channel. User-programmable interconnect elements are disposed at the intersections of these conductors and may be programmed to selectively make connections as is known in the art.

Those of ordinary skill in the art will appreciate that sequential unit 110 is also a flexible circuit. First four-input multiplexer 130 is used to select and control the clock source so that the D flip-flop 124 can be driven from a system clock at first clock input node 132, which would preferably be common to all such units on an integrated circuit, or a clock signal from a clock node derived from other signals presented on second clock node 134 from the general interconnect channels. The connection of clock polarity select node 138 to first four-input multiplexer 130 allows selection of rising or falling edge triggering for the D flip-flop 124. As will be readily appreciated by those of ordinary skill in the art, this function is also easily implemented by a third two-input multiplexer and an exclusive-OR gate.

Referring again to FIGS. 2A and 2C, another set of interconnect conductors is provided for connection to the inputs and outputs of both combinatorial and sequential units 40 and 110. Unlike the general interconnect channels represented by interconnect conductors 92, 94, 96, 98, 100, 102, 104, 106, 148, 150, 152, 154, 156, 158, 160, and 162, these interconnect conductors are local interconnect shared between neighboring logic modules. Also, unlike the general interconnect conductors, the outputs of the combinatorial unit 40 and the sequential unit 110 are hardwired to individual ones of the local interconnect conductors.

The local interconnect conductors are given the same reference numerals in FIGS. 2A and 2C. In the illustrative embodiments depicted in FIGS. 2A and 2C, four local interconnect conductors 164, 166, 168, and 170 are shown, although those of ordinary skill in the art will recognize that the number of local interconnect conductors to be used in any actual realization of the architecture of the present invention will be largely a matter of design choice and the number of combinational and sequential units in the locally interconnected logic modules.

The output of buffer 76 of combinatorial unit 40 is shown hardwired to local interconnect conductor 164. Similarly, the output of buffer 142 of sequential unit 110 is shown hardwired to local interconnect conductor 166. Selected ones of the other data and control inputs of combinatorial unit 40 and sequential unit 110 are shown connectable to local interconnect conductors 164, 166, 168, and 170 via user-programmable interconnect elements shown as circles at the intersections of the data and control inputs of combinatorial unit 40 and sequential unit 110 and local interconnect conductors 164, 166, 168, and 170.

While it is presently preferred to employ the combinatorial unit 40 of FIG. 2A in the present invention, those of ordinary skill in the art will appreciate that other combinatorial units will be usefully employed in the architecture of the present invention. Referring now to FIGS. 3A–3H, alternative combinatorial unit circuits are presented.

Figure 3A:
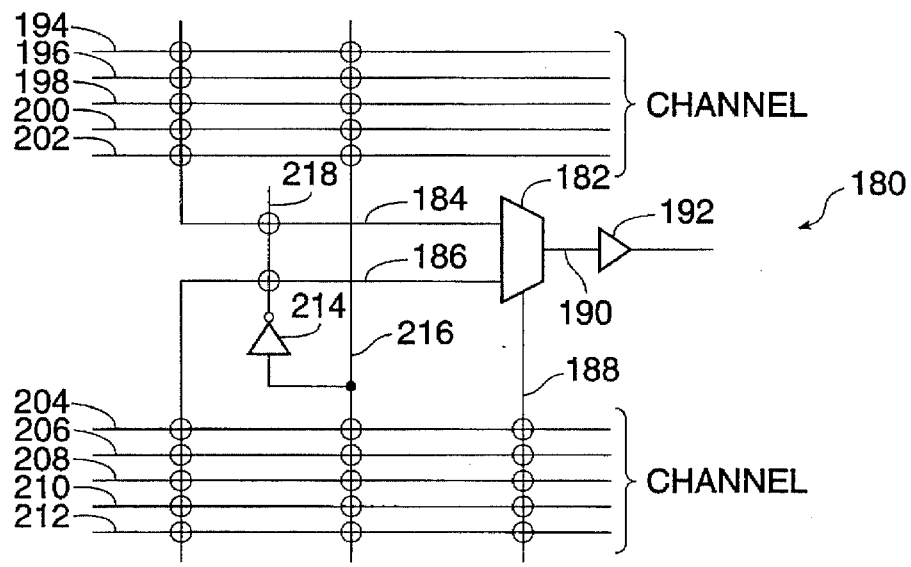
FIGS. 3A–3H are block/schematic diagrams of other exemplary combinational functional units which may be employed in FPGA architectures according to the present invention.

In FIG. 3A an alternative embodiment of a combinatorial unit 180 is shown comprising a single two-input multiplexer 182. First two-input multiplexer 182 has a first data input connected to a first data input node 184, a second data input connected to a second data input node 186, a control input connected to a control input node 188, and an output 190 connected to an output buffer 192.

First data input node 184 is shown intersecting horizontal interconnect conductors 194, 196, 198, 200 and 202 in an upper general interconnect channel. Second data input node 186 and control input node 188 are shown intersecting horizontal interconnect conductors 204, 206, 208, 210 and 212 in a lower general interconnect channel. An inverter 214 is shown with its input connected to an inverter input node 216 and its output connected to inverter output node 218. Inverter input node 216 intersects horizontal interconnect conductors 194, 196, 198, 200, 202, 204, 206, 208, 210 and 212 and inverter output node 218 intersects first and second data input nodes 186 and 184. Each of the intersections is preferably populated with a user programmable interconnect element so that selected ones of the horizontal interconnect conductors may be connected to the first and second data input nodes 186 and 184 either directly or through inverter 214 and to control input node 188. As will be also appreciated by those of ordinary skill in the art, the presence of inverter 214 adds to the versatility of the logic function module circuits by allowing selected ones of the data inputs to be inverted. Those of ordinary skill in the will appreciate that user programmable interconnect elements need not be present at each intersection.

Figure 3B:
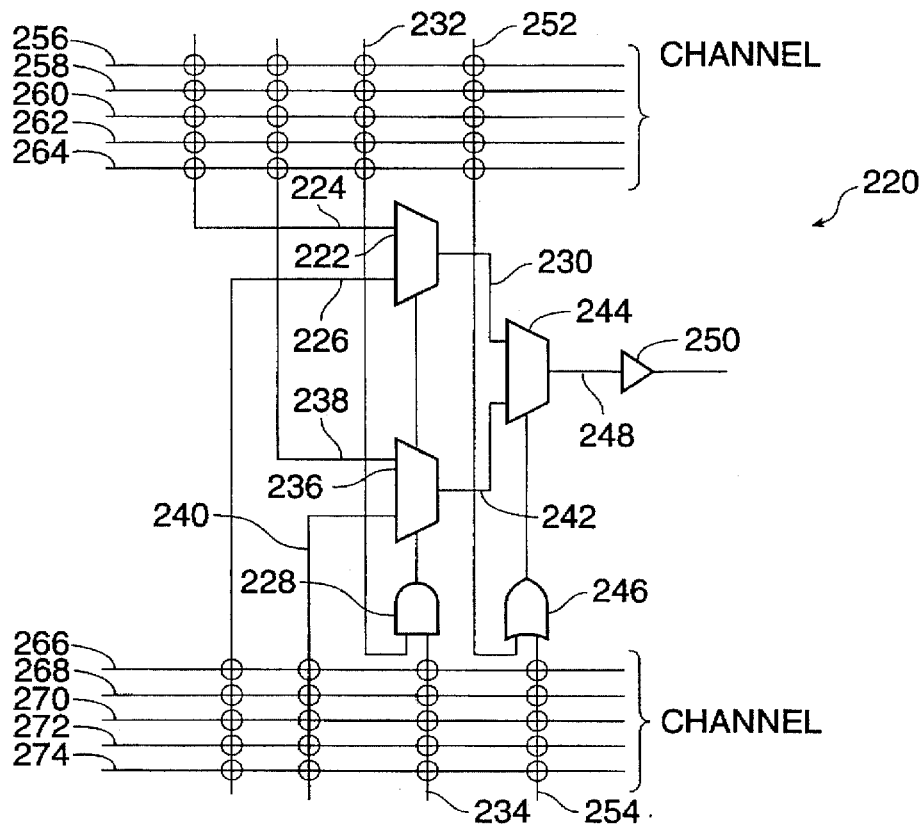

In FIG. 3B a prior art embodiment of a combinatorial unit 220 is shown comprising three two-input multiplexers. First two-input multiplexer 222 has a first data input connected to a first data input node 224, a second data input connected to a second data input node 226, a control input connected to the output of a first gate 228, and an output 230. The first gate 228 has a first input connected to a first control input node 232 and a second input connected to a second control input node 234. Second two-input multiplexer 236 has a first data input connected to a third data input node 288, a second data input connected to a fourth data input node 240, a control input connected to the output of the first gate 228, and an output 242. Third two-input multiplexer 244 has a first data input connected to the output 230 of first two-input multiplexer 222, a second data input connected to the output 242 of second two-input multiplexer 236, a control input connected to the output of a second gate 246, and an output 248 connected to an output buffer 250. The second gate 246 has a first input connected to a third control input node 252 and a second input connected to a fourth control input node 254. First gate 228 and second gate 246 are shown as an AND and an OR gate, respectively, but persons of ordinary skill in the art will recognize that other gate combinations are possible. Persons of ordinary skill in the art will also recognize that the first and second gates may be omitted entirely and that the control inputs of the multiplexers can be connected to the a control input node which intersects the horizontal interconnect conductors of a general interconnect channel.

The first, second and third multiplexers 222, 236 and 244 comprise first and second multiplexer planes in a cascaded multiplexer architecture. The first and second multiplexers 222 and 236 form a first multiplexer plane in which the inputs are connected to input nodes 224, 226, 238 and 240. The outputs 230 and 242 of first and second multiplexers 222 and 236 feed into the inputs of third multiplexer 244. Third multiplexer 244 forms a second multiplexer plane in the cascaded multiplexer architecture.

First and third data input nodes 224 and 238 and first and third control input nodes 232 and 252 are shown intersecting horizontal interconnect conductors 256, 258, 260, 262 and 264 in an upper general interconnect channel. Second and fourth data input nodes 226 and 240 and second and fourth control input nodes 234 and 254 are shown intersecting horizontal interconnect conductors 266, 268, 270, 272 and 274 in a lower general interconnect channel. Each of the intersections is preferably populated with a user programmable interconnect element so that selected ones of the horizontal interconnect conductors may be connected to the first through fourth data input nodes 224, 226, 238 and 240 and first through fourth control input nodes 232, 234, 252 and 254. Those of ordinary skill in the will appreciate that user programmable interconnect elements need not be present at each intersection.

Figure 3C:
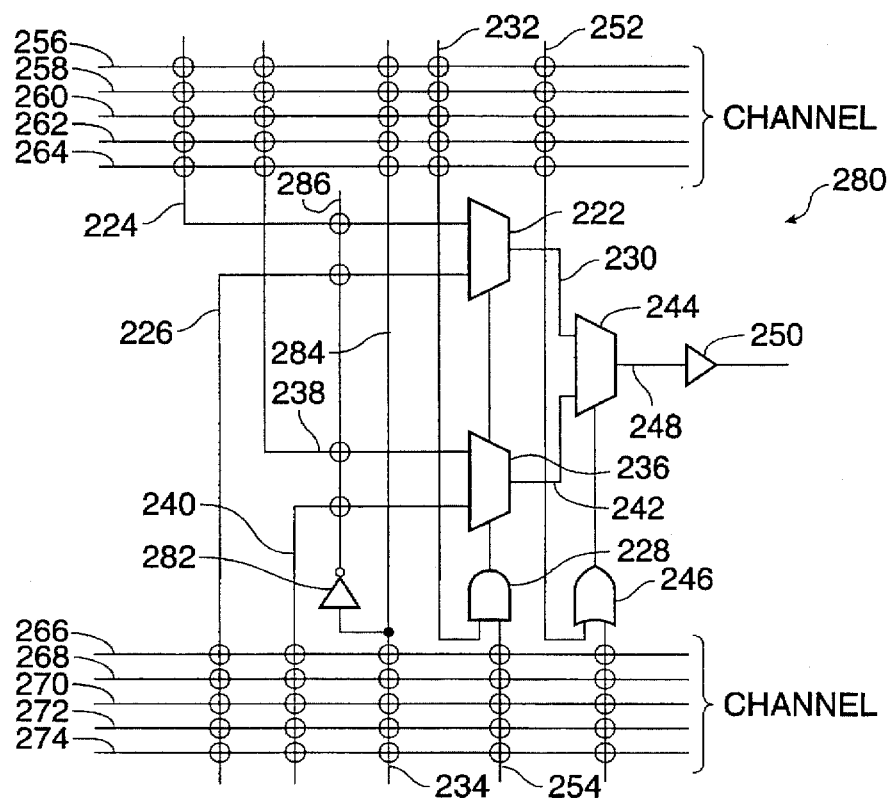

In FIG. 3C, another embodiment of a combinatorial unit 280 is shown. The embodiment shown in FIG. 3C differs from that shown in FIG. 3B in that an inverter 282 is shown which increases the versatility of the combinatorial unit 280. (The same reference numerals shown in FIG. 3B are shown in FIG. 3C). The inverter 282 has its input connected to an input node 284 which intersects horizontal interconnect conductors 256, 258, 260, 262, 264, 266, 268, 270, 272 and 274. The output of inverter 282 is connected to an output node 286 which intersects first through fourth data input nodes 224, 226, 238 and 240. Each of the intersections is preferably populated with a user programmable interconnect element so that selected ones of the horizontal interconnect conductors may be connected to the inverter input node 284 and that selected ones of the data input nodes 224, 226, 238 and 240 may be connected to the inverter output node 286. Those of ordinary skill in the will appreciate that user programmable interconnect elements need not be present at each intersection.

Figure 3D:
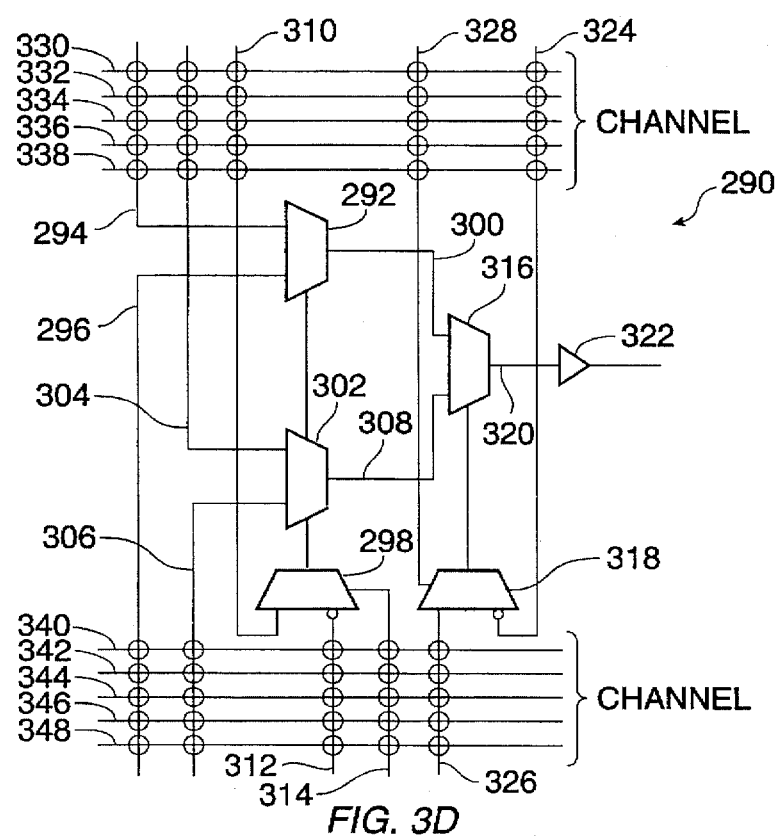

In. FIG. 3D another alternative embodiment of a combinatorial unit 290 is shown comprising three two-input multiplexers and two two-input control multiplexers. First two-input multiplexer 292 has a first data input connected to a first data input node 294, a second data input connected to a second data input node 296, a control input connected to the output of a first two-input control multiplexer 298 and an output 300. Second two-input multiplexer 302 has a first data input connected to a third data input node 304, a second data input connected to a fourth data input node 306, a control input connected to the output of first two-input control multiplexer 298 and an output 308. The first two-input control multiplexer 298 has an input connected to a first input control node 310, an inverting input connected to a second input control node 312 and a control input connected to a first input control multiplexer node 314. Third two-input multiplexer 316 has a first data input connected to the output 300 of first two-input multiplexer 292, a second data input connected to the output 308 of second two-input multiplexer 302, a control input connected to the output of second two-input control multiplexer 318 and an output 320 connected to an output buffer 322. The second two-input control multiplexer 318 has an inverting input connected to a third input control node 324, an input connected to a fourth input control node 326 and a control input connected to a second input control multiplexer node 328.

The first, second and third multiplexers 292, 302 and 316 comprise a cascaded multiplexer architecture in which first and second multiplexers 292 and 302 form a first multiplexer plane and third multiplexer 316 forms a second multiplexer plane.

First and third data input nodes 294 and 304, first and third input control nodes 310 and 324 and second input control multiplexer node 328 are shown intersecting horizontal interconnect conductors 330, 332, 334, 336 and 338 in an upper general interconnect channel. Second and fourth data input nodes 296 and 306, second and fourth input control nodes 312 and 326 and first input control multiplexer node 314 are shown intersecting horizontal interconnect conductors 340, 342, 344, 346 and 348 in a lower general interconnect channel. Each of the intersections is preferably populated with a user programmable interconnect element so that selected ones of the horizontal interconnect conductors may be connected to the first through fourth data input nodes 294, 296, 304 and 306, first through fourth input control nodes 310, 312, 324 and 326, and first and second input control multiplexer nodes 314 and 328. Those of ordinary skill in the will appreciate that user programmable interconnect elements need not be present at each intersection.

Figure 3E:
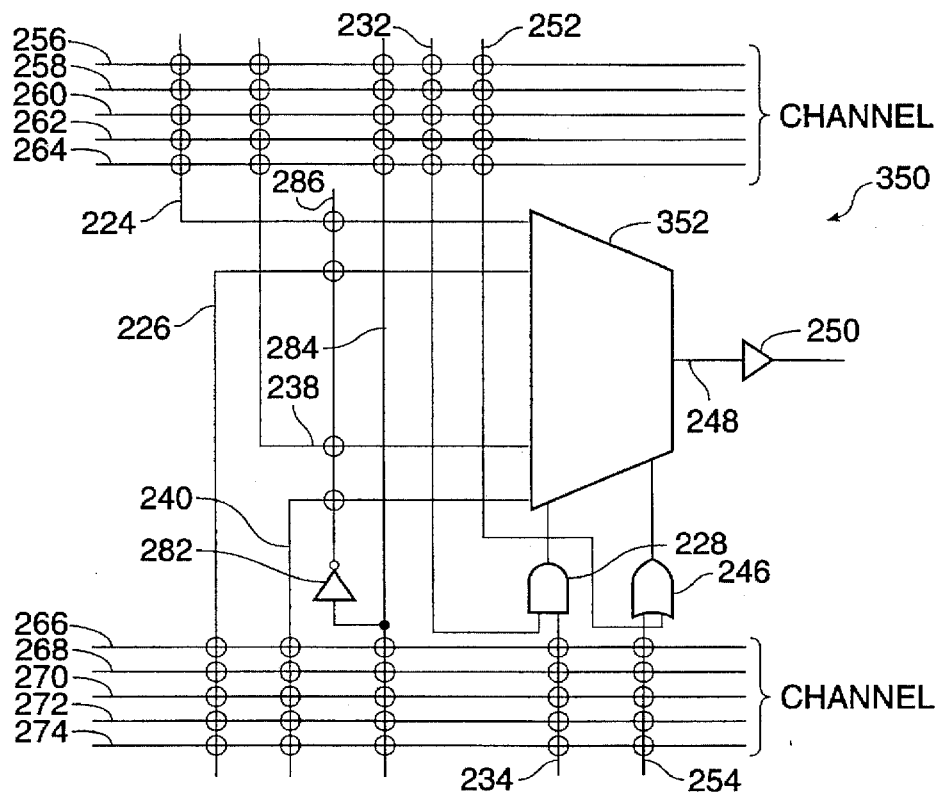

In FIG. 3E an alterative embodiment of a logic function module 350 is shown in which a single four-input multiplexer 352 is employed instead of the three two-input cascaded multiplexer architecture shown in FIGS. 3B, 3C and 3D. Those of ordinary skill in the art will readily recognize that various arrangements of multiplexers may be employed to implement the four-input logic function modules shown in FIGS. 3B through 3E.

Figure 3F:
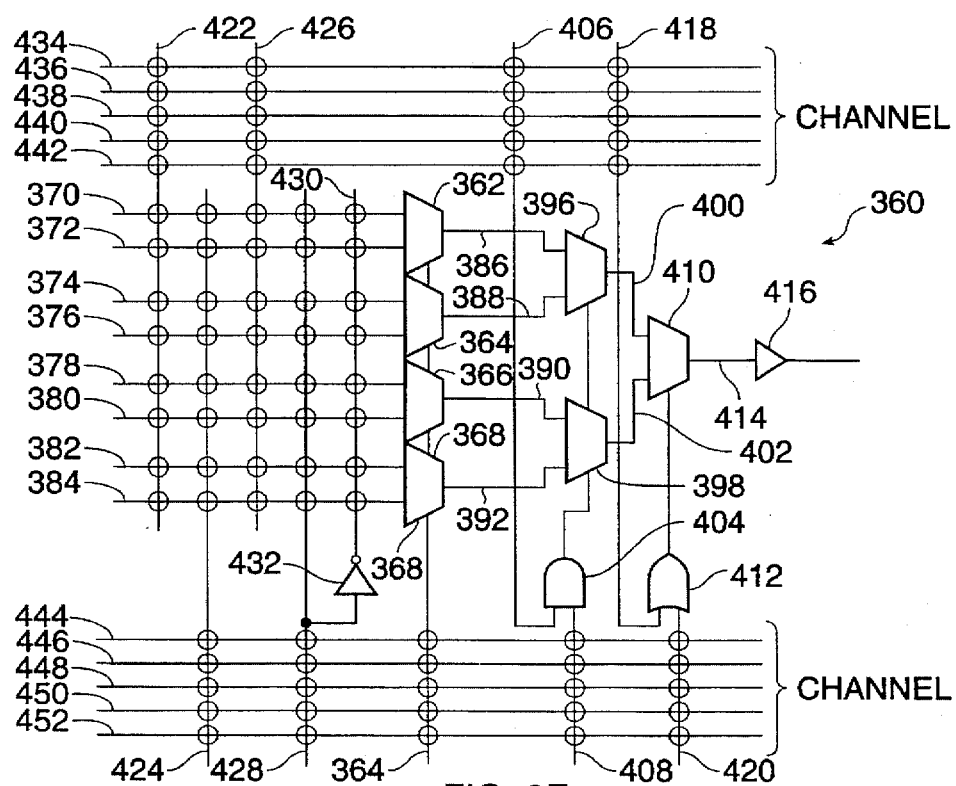

In FIG. 3F another alternative embodiment of a combinatorial unit 360 is shown comprising seven two-input multiplexers. First through fourth two-input multiplexers 362, 364, 366 and 368 each have first and second data inputs connected respectively to first through eighth data inputs nodes 370, 372, 374, 376, 378, 380, 382 and 384, have outputs 386, 388, 390 and 392, respectively, and each have a control input connected to first input control node 394 as shown in FIG. 3F. Fifth and sixth two-input multiplexers 396 and 398 each have first and second data inputs connected respectively to the outputs 386, 388, 390 and 392, have outputs 400 and 402, respectively, and each have a control input connected to the output of first gate 404. The first gate 404 has a first input connected to a second control input node 406 and a second input connected to a third control input node 408. Seventh two-input multiplexer 410 has a first data input connected to the output 400 of fifth two-input multiplexer 396, a second data input connected to the output 402 of sixth two-input multiplexer 398, a control input connected to the output of a second gate 412, and an output 414 connected to an output buffer 416. The second gate 412 has a first input connected to a fourth control input node 418 and a second input connected to a fifth control input node 420. First gate 404 and second gate 412 are shown as an AND and an OR gate, respectively, but persons of ordinary skill in the art will recognize that other gate combinations are possible.

The first through seventh multiplexers 362, 364, 366, 368, 396, 398 and 410 comprise a cascaded multiplexer architecture in which first, second, third and fourth multiplexers 362, 364, 366 and 368 form a first multiplexer plane, fifth and sixth multiplexers 396 and 398 form a second multiplexer plane and seventh multiplexer 410 forms a third multiplexer plane.

A plurality of interconnect conductors 422, 424, 426, 428, and 430 intersect the first through eighth data input nodes 370, 372, 374, 376, 378, 380, 382 and 384 and each of the intersections is preferably populated with a user programmable interconnect element and may be programmed to selectively make connections between selected ones of the interconnect conductors and selected ones of the first through eighth data input nodes as is known in the art. Those of ordinary skill in the will appreciate that user programmable interconnect elements need not be present at each intersection. One of the plurality of interconnect conductors 430 is connected to another one of the interconnect conductors 428 through an inverter 432. As will be appreciated by those of ordinary skill in the art, the presence of inverter 432 adds to the versatility of the logic function module circuits by allowing selected ones of the data inputs to be inverted. The use of interconnect conductors 422, 424, 426, 428, and 430 to connect the input nodes 370, 372, 374, 376, 378, 380, 382 and 384 to the general interconnect channel provides several distinct advantages over directly intersecting the data input nodes with the general interconnect channels as shown in FIGS. 3A-3E. First, it reduces capacitive loading of the net being programmed which provides enhanced circuit performance. Second, there is greater symmetry and flexibility in connecting inputs to the general interconnect channels. Finally, the required number of general interconnect channels may remain substantially the same as the number of data input nodes into the cascaded multiplexer architecture increases. It will also be appreciated that the interconnect conductors 78a-86a shown in FIG. 2A have the same advantages as recited for the interconnect conductors 422, 424, 426, 428, and 430 in FIG. 3F.

As may also be seen from FIG. 3F, the interconnect conductors 422 and 426 and the second and fourth control inputs 406 and 418 are shown intersecting horizontal interconnect conductors 434, 436, 438, 440 and 442 in an upper general interconnect channel. The interconnect conductors 424 and 428 and the first, third and fifth control inputs 394, 408 and 420 are shown intersecting horizontal interconnect conductors 444, 446, 448, 450 and 452 in a lower general interconnect channel. Each of the intersections is preferably populated with a user programmable interconnect element and may be programmed to selectively make connections as is known in the art. Those of ordinary skill in the will appreciate that user programmable interconnect elements need not be present at each intersection.

Figure 3G:
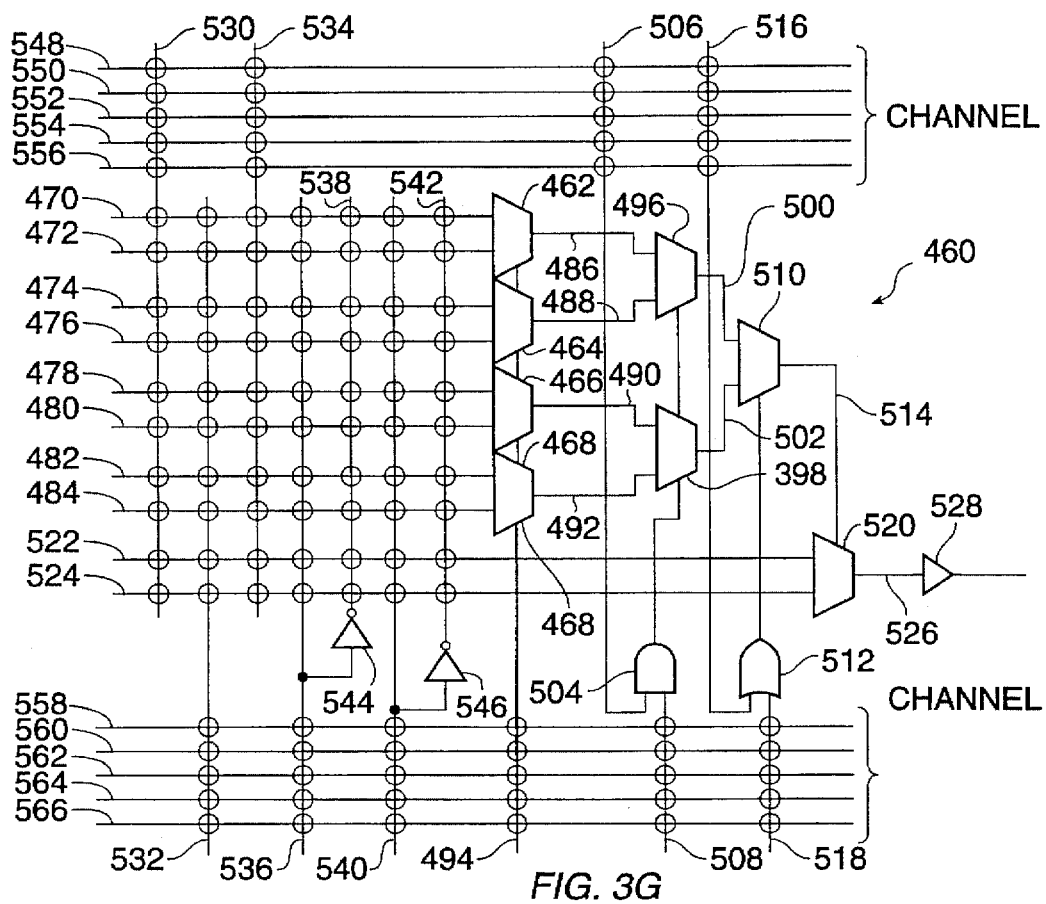
Figure 3H:
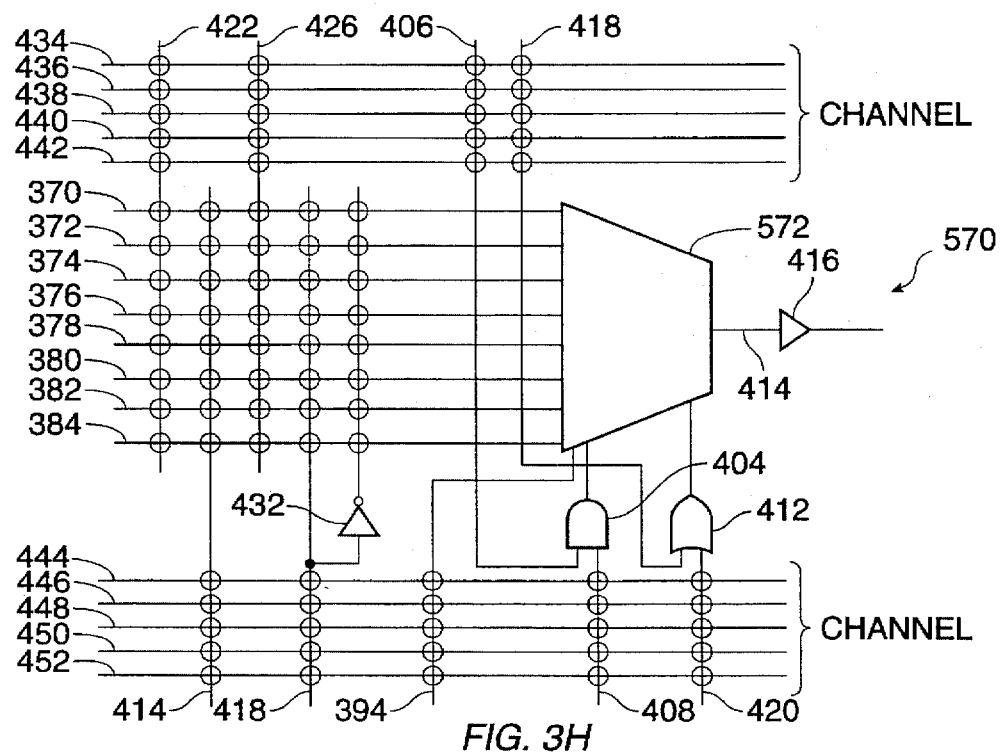

In FIG. 3G a sixth alternative embodiment of a combinatorial unit 460 is shown comprising eight two-input multiplexers. First through fourth two-input multiplexers 462, 464, 466 and 468 each have first and second data inputs connected respectively to first through eighth data inputs nodes 470, 472, 474, 476, 478, 480, 482 and 484, have outputs 486, 488, 490 and 492, respectively, and each have a control input connected to first input control node 494 as shown in FIG. 3H. Fifth and sixth two-input multiplexers 496 and 498 each have first and second data inputs connected respectively to the outputs 486, 488, 490 and 492, have outputs 500 and 502, respectively, and each have a control input connected to the output of first gate 504. The first gate 504 has a first input connected to a second control input node 506 and a second input connected to a third control input node 508. Seventh two-input multiplexer 510 has a first data input connected to the output 500 of fifth two-input multiplexer 496, a second data input connected to the output 502 of sixth two-input multiplexer 498, a control input connected to the output of a second gate 512, and an output 514. The second gate 512 has a first input connected to a fourth control input node 516 and a second input connected to a fifth control input node 518. First gate 504 and second gate 512 are shown as an AND and an OR gate, respectively, but persons of ordinary skill in the art will recognize that other gate combinations are possible. Eighth two-input multiplexer 520 has first and second data inputs connected to a ninth and tenth data input nodes 522 and 524, respectively, a control input connected to the output 514 of seventh two-bit multiplexer 510, and an output 526 connected to an output buffer 528.

The first through seventh multiplexers 462, 464, 466, 468, 496, 498 and 510 comprise a cascaded multiplexer architecture in which first, second, third and fourth multiplexers 462, 464, 466 and 468 form a first multiplexer plane, fifth and sixth multiplexers 496 and 498 form a second multiplexer plane and seventh multiplexer 510 forms a third multiplexer plane.

A plurality of interconnect conductors 530, 532, 534, 536, 538, 540 and 542 intersect the first through tenth data input nodes 470, 472, 474, 476, 478, 480, 482, 484, 522 and 524 and each of the intersections is preferably populated with a user programmable interconnect element and may be programmed to selectively make connections between selected ones of the interconnect conductors and selected ones of the first through tenth data input nodes. Those of ordinary skill in the will appreciate that user programmable interconnect elements need not be present at each intersection. Each of the interconnect conductors 538 and 542 are also connected to interconnect conductors 536 and 540 through inverters 544 and 546, respectively. As will be appreciated by those of ordinary skill in the art, the presence of inverters 544 and 546 adds to the versatility of the logic function module circuits by allowing a selected ones of the data inputs to be inverted. As in FIG. 3F, the use of interconnect conductors 530, 532, 534, 536, 538, 540 and 542 reduces capacitive loading, provides greater symmetry and flexibility and limits the required number of general interconnect channels.

As may also be seen from FIG. 3G, the interconnect conductors 530 and 534 and the second and fourth control inputs 506 and 516 are shown intersecting horizontal interconnect conductors 548, 550, 552, 554 and 556 in an upper general interconnect channel. The interconnect conductors 532, 536 and 540 and the first, third and fifth control inputs 504, 508 and 518 are shown intersecting horizontal interconnect conductors 558, 560, 562, 564 and 566 in a lower general interconnect channel. Each of the intersections is preferably populated with a user programmable interconnect element and may be programmed to selectively make connections as is known in the art. Those of ordinary skill in the will appreciate that user programmable interconnect elements need not be present at each intersection.

Those of ordinary skill in the art will recognize that the first multiplexer plane in both FIGS. 3F and 3G may comprise various arrangements of multiplexers, for example, a single four-input multiplexer and two two-input multiplexers connected to eight input nodes. The second multiplexer plane could then be a single two-input multiplexer with inputs connected to the outputs of the two two-input multiplexers from the first plane. The third plane could then be a single two-input multiplexer with inputs connected to the four-input multiplexer of the first plane and the two-input multiplexer of the second plane. As such, it will be recognized that in a cascade multiplexer architecture, the outputs of the multiplexers in a multiplexer plane do not necessarily have to be connected to the inputs of the multiplexers in the next immediately successive multiplexer plane.

In FIG. 3H an alternative embodiment of the logic function module 570 is shown in which a single eight-input multiplexer 572 is employed instead of the seven two-input cascaded multiplexer architecture shown in FIGS. 3F and 3G. Those of ordinary skill in the art will readily recognize that various arrangements of multiplexers may be employed to implement the eight-input logic function modules shown in FIGS. 3F through 3H.

Local interconnect conductors are not shown for the alternative embodiments of the combinatorial units 180, 220, 280, 290, 350, 360, 460 and 570 in FIGS. 3A–3H to avoid over complicating the disclosure. One of ordinary skill in the art will recognize that as shown in the illustrative embodiments shown in FIGS. 2A and 2C, selected ones of the data and control inputs shown in the combinatorial units 180, 220, 280, 290, 350, 360, 460 and 570 in FIGS. 3A–3H may be connected to local interconnect conductors.

Though the embodiments in FIGS. 3A–3H show structures with four and eight inputs into the first multiplexer plane, those of ordinary skill in the art will readily recognize that the invention disclosed herein is not so limited. The cascaded multiplexer architecture described herein is not limited by the number of inputs to the first multiplexer plane, nor the number of planes present in the cascaded multiplexer architecture.

As previously noted, it is presently preferred to combine three functional units into a logic module. These three units may be identical, i.e., the logic module may comprise three combinatorial units or three sequential units, or may be mixed, i.e., the logic module may comprise one combinatorial unit and two sequential units. In logic modules containing mixtures of combinatorial units and sequential units, it may be advantageous to internally connect the prebuffered output of the combinatorial unit to one of the inputs of the first multiplexer of the sequential unit. Such an arrangement is shown in FIG. 4A.

Figure 4A:
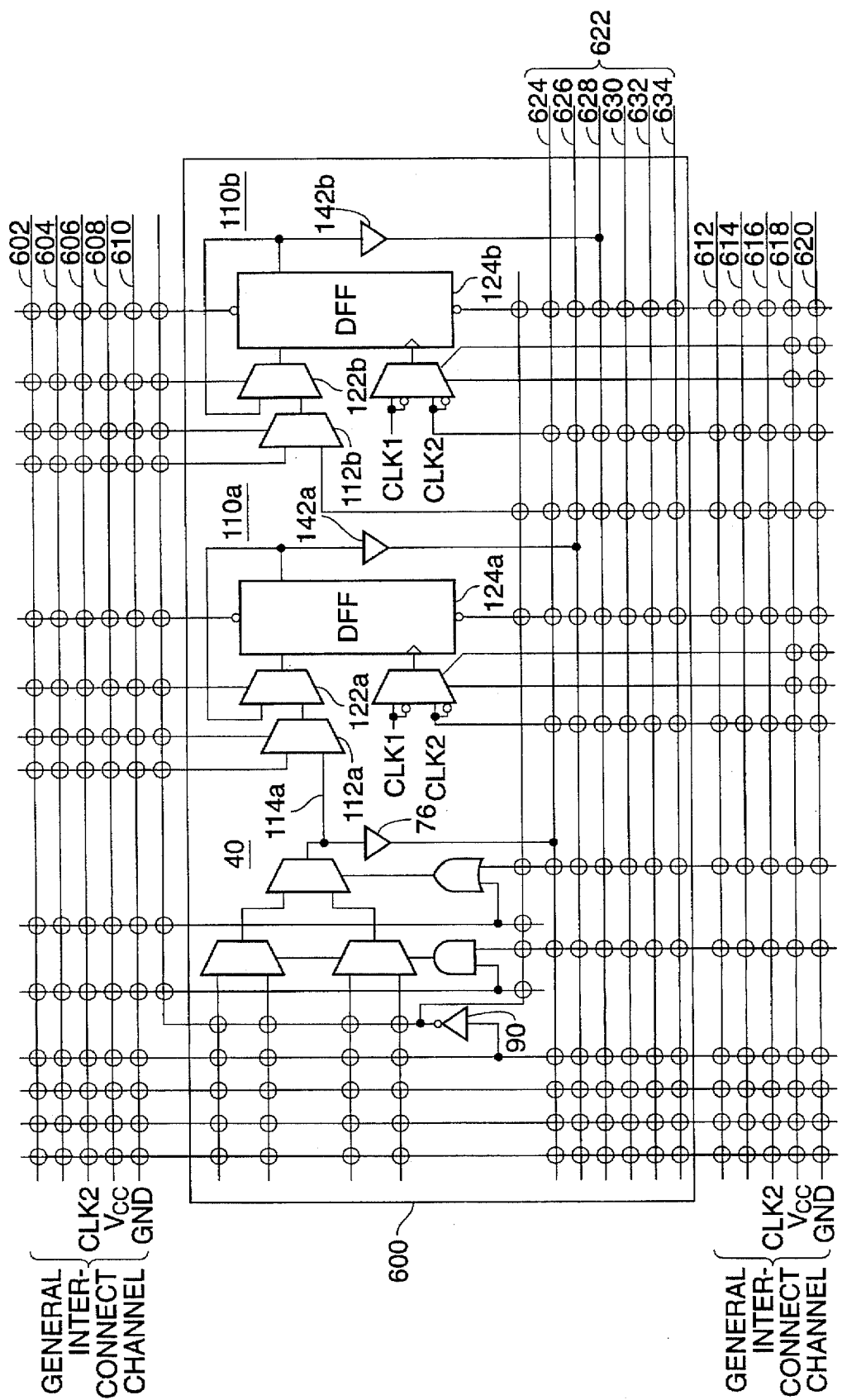
FIG. 4A is a block/schematic diagram of one presently preferred logic module according to the present invention comprising a combination of the functional units of FIGS. 2A and 2C.

Referring now to FIG. 4A, logic function module 600 is depicted in block/schematic format. In the illustrative embodiment of FIG. 4A, logic function module 600 is shown to include a combinatorial unit 40 and two sequential units 110a and 110b. For convenience, the elements of these units depicted in FIG. 4A will be referred to using the same reference numerals used in FIGS. 2A and 2C, although not all elements are numbered in FIG. 4A to avoid overcrowding the drawing.

An upper general interconnect channel includes general interconnect conductors 602, 604, 606, 608, and 610, some of which may be dedicated to clock signal and dedicated logic level functions, and a lower general interconnect channel includes general interconnect conductors 612, 614, 616, 618, and 620, some of which may also be dedicated to clock signal and dedicated logic level functions. A local interconnect channel 622 includes local interconnect conductors 624, 626, 628, 630, 632 and 634. The output of output buffer 76 of combinatorial unit 40 is shown hardwired to local interconnect conductor 624. The output of output buffer 142a of combinatorial unit 110a is shown hardwired to local interconnect conductor 626. The output of output buffer 142b of combinatorial unit 110b is shown hardwired to local interconnect conductor 628. In addition, an internal hardwired connection is shown made between the prebuffered output of combinatorial unit 40 and the first input 114a of multiplexer 112a in sequential unit 110a. Alternatively, the pre-buffered output of combinatorial unit 40 can be hardwired to the control input of multiplexer 112a.

Those of ordinary skill in the art will appreciate that the logic function module of FIG. 4A is extremely flexible and permits implementation of a wide variety of combinatorial and sequential logic functions. When a plurality of these logic function modules 600 are placed in an array as depicted in FIG. 1, the advantage of the local interconnect channel becomes apparent. In such an arrangement, the outputs of the combinatorial and sequential elements are individually hardwired to different ones of local interconnect conductors 624, 626, 628, 630, 632, and 634. Because the hardwired connections bypass any user-programmable interconnect elements in the general interconnect channels, any time delay which such interconnect elements will normally introduce to signals passing through them are eliminated, resulting in a circuit which is, in effect, a larger, faster, single logic function module.

FIG. 4A also illustrates the extra versatility which the addition of inverter 90 of FIG. 2A adds to the logic module function. As shown in FIG. 4A, the inverter 90 shown physically located in the combinatorial unit 40 may be used with the combinatorial unit 40 or with either sequential unit 110a and 110b by programming appropriate antifuses to connect its output to the data inputs and control inputs of the data multiplexers 112a and 122a associated with sequential unit 110a and 112b and 122b associated with sequential unit 110b and to the set and reset inputs of the D flip-flops 124a and 124b in the sequential units 110a and 110b, respectively.

According to yet another aspect of the present invention, the mixture and placement of the combinatorial and sequential components of pairs of logic function may be advantageously varied. This aspect of the invention is illustrated in FIGS. 4B-4D, schematic representations of the layouts of logic function module pairs connected by local interconnect channels according to the present invention.

Figure 4B:
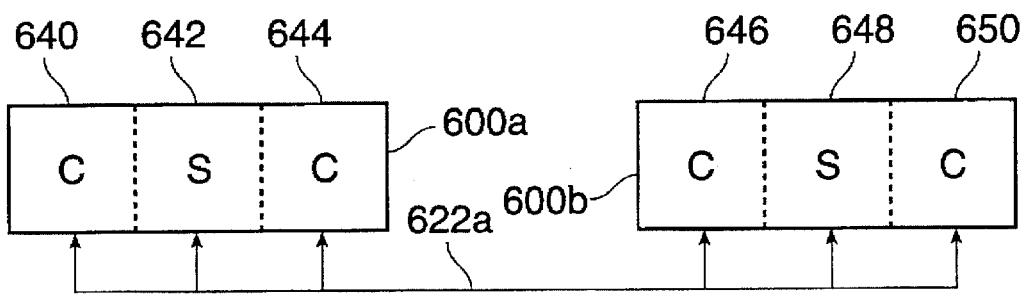
FIGS. 4B–4D are schematic representations of layout arrangements for logic function units within logic modules connected by local interconnect channels according to the present invention.

Referring first to FIG. 4B, a logic function module pair comprising logic function modules 600a and 600b are shown connected by local interconnect bus 622a. Logic function module 600a comprises a leftmost combinatorial unit 640, a center sequential unit 642, and a rightmost combinatorial unit 644. Logic function module 600b comprises a leftmost combinatorial unit 646, a center sequential unit 648, and a rightmost combinatorial unit 650.

Those of ordinary skill in the art will recognize that the outputs of the combinatorial and sequential units 640, 642, 644, 646, 648, and 650 are hardwired to different individual local interconnect conductors of local interconnect bus 622a in the manner depicted in FIG. 4A for a single logic function unit 600.

Figure 4C:
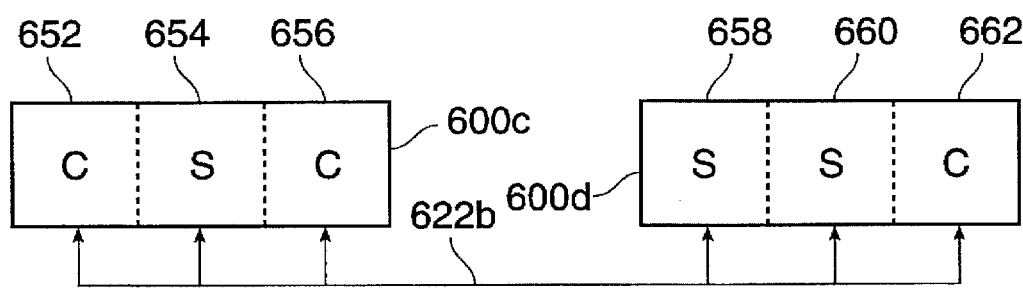
Figure 4D:
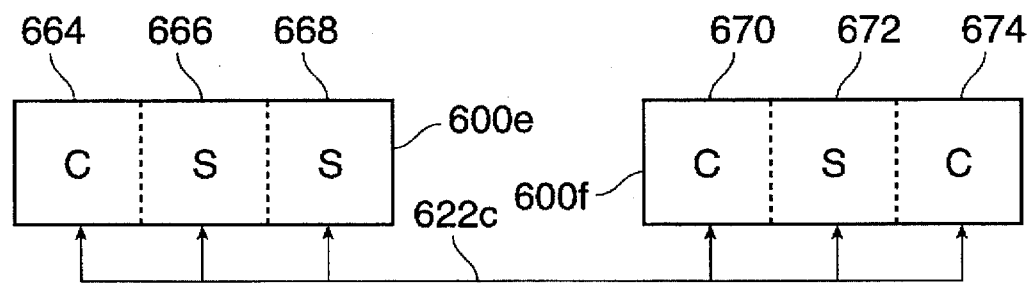

Other variations of the logic module pair layout according to the present invention are shown in FIGS. 4C and 4D. In FIG. 4C, a logic function module pair comprising logic function modules 600c and 600d are shown connected by local interconnect bus 622b. Logic function module 600c comprises a leftmost combinatorial unit 652, a center sequential unit 654, and a rightmost combinatorial unit 656. Logic function module 600d comprises a leftmost sequential unit 658, a center sequential unit 660, and a rightmost combinatorial unit 662. In FIG. 4D, a logic function module pair comprising logic function modules 600e and 600f are shown connected by local interconnect bus 622c. Logic function module 600e comprises a leftmost combinatorial unit 664, a center sequential unit 666, and a rightmost sequential unit 668. Logic function module 600f comprises a leftmost combinatorial unit 670, a center sequential unit 672, and a rightmost combinatorial unit 674.

According to another aspect of the present invention, the interconnect conductors of the interconnect architecture of the present invention may be supplied as segments. The ability to temporarily connect the segments together for purposes such as testing may be provided. Further, user-programmable interconnect elements may be provided to programmably connect the segments together to produce longer interconnect conductors during normal operation of the integrated circuit.

Referring again to FIG. 2A, each of interconnect conductors 78, 80, 82, 84, and 86 are divided into segments by pass transistors. Thus, interconnect conductor 78 is connected to one of the source/drain terminals of pass transistor 700. The other source/drain terminal of pass transistor 700 is connected to interconnect conductor 78a, which may be considered as a downwardly extending vertical extension of interconnect conductor 78. In similar fashion, interconnect conductor 80 is connected to one of the source/drain terminals of pass transistor 702. The other source/drain terminal of pass transistor 702 is connected to interconnect conductor 80a, which may be considered as an upwardly extending vertical extension of interconnect conductor 80. Interconnect conductor 82 is connected to one of the source/drain terminals of pass transistor 704. The other source/drain terminal of pass transistor 704 is connected to interconnect conductor 82a, which may be considered as a downwardly extending vertical extension of interconnect conductor 82. Interconnect conductor 84 is connected to one of the source/drain terminals of pass transistor 706. The other source/drain terminal of pass transistor 706 is connected to interconnect conductor 84a, which may be considered as an upwardly extending vertical extension of interconnect conductor 84. Interconnect conductor 86 is connected to one of the source/drain terminals of pass transistor 708. The other source/drain terminal of pass transistor 708 is connected to interconnect conductor 86a, which may be considered as an upwardly extending vertical extension of interconnect conductor 86.

As shown in FIG. 2A, the locations of the pass transistors are preferably staggered to add to the versatility of the interconnect architecture. Thus pass transistors 700 and 704 are located at one vertical position on their associated interconnect conductors while pass transistors 702, 706, and 708 are located at another vertical position on their associated interconnect conductors. The gates of the pass transistors are driven by the program and test control circuit 30 (FIG. 1). While the gates of pass transistors 700 and 704 are shown connected to a common gate line. 710 and the gates of pass transistors 702, 706, and 708 are shown connected to a common gate line 712, those of ordinary skill in the art will recognize that other arrangements are possible.

Those of ordinary skill in the art will appreciate that interconnect conductors 78a and 82a will be connectable through user-programmable interconnect elements to the logic module (not shown in FIG. 2A) located below logic module in the integrated circuit array and that interconnect conductors 80a, 84a, and 86a will be connectable through user-programmable interconnect elements to the logic module (not shown in FIG. 2A) located above logic module in the integrated circuit array. The particular segmentation scheme used in an actual architecture fabricated according to the present invention will be somewhat arbitrary and largely a matter of design choice dictated by the particular architectural layout.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A programmable logic module disposed in a network of interconnect conductors comprising a plurality of horizontal and vertical channels of interconnect conductors, the module comprising:

a first logic unit having a first input connected to a first input conductor and a first output connected to a first output conductor;

a second logic unit having a second input connected to a second input conductor and a second output connected to a second output conductor;

a third logic unit having a third input connected to a third input conductor and a third output connected to a third output conductor; and a plurality of local interconnect conductors, a first one of said local interconnect conductors connected to said first output conductor, a second one of said local interconnect conductors connected to said second output conductor, a third one of said local interconnect conductors connected to said third output conductor, at least some of said local interconnect conductors intersecting said first input conductor, said second input conductor, and said third input conductor, said plurality of local interconnect conductors selectively connectable to individual ones of said first input conductor, said second input conductor, and said third input conductor by user-programmable interconnect elements, said plurality of local interconnect conductors selectively connectable to individual ones of the interconnect conductors in the plurality of horizontal and vertical channels of interconnect conductors.

2. The programmable logic module of claim 1 wherein at least one of said first logic unit, said second logic unit, and said third logic unit is a combinatorial logic unit.

3. The programmable logic module of claim 1 wherein at least two of said first logic unit, said second logic unit, and said third logic unit are combinatorial logic units.

4. The programmable logic module of claim 1 wherein each of said first logic unit, said second logic unit, and said third logic unit is a combinatorial logic unit.

5. The programmable logic module of claim 1 wherein at least one of said first logic unit, said second logic unit, and said third logic unit is a sequential logic unit.

6. The programmable logic module of claim 1 wherein at least two of said first logic unit, said second logic unit, and said third logic unit are sequential logic units.

7. The programmable logic module of claim 1 wherein each of said first logic unit, said second logic unit, and said third logic unit is a sequential logic unit.

8. The programmable logic module of claim 1 wherein said first logic unit is a combinatorial logic unit, said second logic unit is a sequential logic unit, and said first output conductor is connected to said second input conductor.

9. The programmable logic module of claim 1 wherein said user-programmable interconnect elements are antifuses.

10. A programmable logic module disposed in a network of interconnect conductors comprising a plurality of horizontal and vertical channels of interconnect conductors, the module comprising:

at least three logic units, each logic unit having an input connected to an input conductor and an output connected to an output conductor; and a plurality of local interconnect conductors, at least some of said local interconnect conductors intersecting said input conductors, at least some of said local interconnect conductors intersecting said output conductors, said plurality of local interconnect conductors selectively connectable to individual ones of said input conductors and said output conductors by user-programmable interconnect elements, said plurality of local interconnect conductors selectively connectable to individual ones of the interconnect conductors in the plurality of horizontal and vertical channels of interconnect conductors.

11. The programmable logic module of claim 10 wherein at least one of said at least three logic units is a combinatorial unit.

12. The programmable logic module of claim 10 wherein at least one of said at least three logic units is a sequential unit.

13. The programmable logic module of claim 10 wherein a first one of said at least three logic units is a combinatorial unit, a second one of said at least three logic units is a sequential unit, and the output of said first one of said at least three logic units is connected to the input of said second one of said at least three logic units.

14. The programmable logic module of claim 10 wherein said user-programmable interconnect elements are antifuses.

15. A programmable logic module pair disposed in a network of interconnect conductors comprising a plurality of horizontal and vertical channels of interconnect conductors, the module pair comprising:

a first logic module comprising:
a first logic unit having a first input connected to a first input conductor and a first output connected to a first output conductor; a second logic unit having a second input connected to a second input conductor and a second output connected to a second output conductor; and a third logic unit having a third input connected to a third input conductor and a third output connected to a third output conductor;

a second logic module comprising:
a fourth logic unit having a fourth input connected to a fourth input conductor and a fourth output connected to a fourth output conductor; a fifth logic unit having a fifth input connected to a fifth input conductor and a fifth output connected to a fifth output conductor; and a sixth logic unit having a sixth input connected to a sixth input conductor and a sixth output connected to a sixth output conductor; and a plurality of local interconnect conductors, a first one of said local interconnect conductors connected to said first output conductor, a second one of said local interconnect conductors connected to said second output conductor, a third one of said local interconnect conductors connected to said third output conductor, a fourth one of said local interconnect conductors connected to said fourth output conductor, a fifth one of said local interconnect conductors connected to said fifth output conductor, a sixth one of said local interconnect conductors connected to said sixth output conductor, at least some of said local interconnect conductors intersecting said fast input conductor, said second input conductor, and said third input conductor, said fourth input conductor, said fifth input conductor, said sixth input conductor, said plurality of local interconnect conductors selectively connectable to individual ones of said first input conductor, said second input conductor, said third input conductor, said fourth input conductor, said fifth input conductor, and said sixth input conductor by user-programmable interconnect elements, said plurality of local interconnect conductors selectively connectable to individual ones of the interconnect conductors in the plurality of horizontal and vertical channels of interconnect conductors.

16. The programmable logic module pair of claim 15 wherein at least one of said first logic unit, said second logic unit, and said third logic unit of said first logic module is a combinatorial logic unit.

17. The programmable logic module pair of claim 15 wherein at least two of said first logic unit, said second logic unit, and said third logic unit of said first logic module are combinatorial logic units.

18. The programmable logic module pair of claim 15 wherein each of said first logic unit, said second logic unit, and said third logic unit of said first logic module is a combinatorial logic unit.

19. The programmable logic module pair of claim 15 wherein at least one of said first logic unit, said second logic unit, and said third logic unit of said first logic module is a sequential logic unit.

20. The programmable logic module pair of claim 15 wherein at least two of said first logic unit, said second logic unit, and said third logic unit of said first logic module are sequential logic units.

21. The programmable logic module pair of claim 15 wherein each of said first logic unit, said second logic unit, and said third logic unit of said first logic module is a sequential logic unit.

22. The programmable logic module pair of claim 15 wherein said first logic unit is a combinatorial logic unit, said second logic unit is a sequential logic unit, and said first output conductor is connected to said second input conductor.

23. The programmable logic module pair of claim 15 wherein at least one of said fourth logic unit, said fifth logic unit, and said sixth logic unit of said second logic module is a combinatorial logic unit.

24. The programmable logic module pair of claim 15 wherein at least two of said fourth logic unit, said fifth logic unit, and said sixth logic unit of said second logic module are combinatorial logic units.

25. The programmable logic module pair of claim 15 wherein each of said fourth logic unit, said fifth logic unit, and said sixth logic unit of said second logic module is a combinatorial logic unit.

26. The programmable logic module pair of claim 15 wherein at least one of said fourth logic unit, said fifth logic unit, and said sixth logic unit of said second logic module is a sequential logic unit.

27. The programmable logic module pair of claim 15 wherein at least two of said fourth logic unit, said fifth logic unit, and said sixth logic unit of said second logic module are sequential logic units.

28. The programmable logic module pair of claim 15 wherein each of said fourth logic unit, said fifth logic unit, and said sixth logic unit of said second logic module is a sequential logic unit.

29. The programmable logic module pair of claim 15 wherein said fourth logic unit is a combinatorial logic unit, said fifth logic unit is a sequential logic unit, and said fourth output conductor is connected to said fifth input conductor.

30. The programmable logic module pair of claim 15 wherein at least some of said plurality of local interconnect conductors are segmented and further comprising user-programmable interconnect elements for selectively connecting said segments together.

31. The programmable logic module pair of claim 15 wherein said user-programmable interconnect elements are antifuses.

* * * * *

UNITED STATES PATENT AND TRADEMARK OFFICE
CERTIFICATE OF CORRECTION

PATENT NO. : 5,698,992
INVENTOR(S) : Khaled A. El Ayat, et. al.
DATED : December 16, 1997

It is certified that error appears in the above-identified patent and that said Letters Patent is hereby corrected as shown below:

The Title page, should be deleted and substitute therefor the attached Title page.

Drawings:

Delete Fig. 3C, Fig. 3F, Fig. 3G and Fig. H and substitute therefor the attached pages.

United States Patent [19]

El Ayat et al.

[11] Patent Number: 5,698,992

[45] Date of Patent: *Dec. 16, 1997

[54] PROGRAMMABLE LOGIC MODULE AND ARCHITECTURE FOR FIELD PROGRAMMABLE GATE ARRAY DEVICE

[75] Inventors: Khaled A. El Ayat, Cupertino; Gregory W. Bakker, Sunnyvale; Jung-Cheun Lien, San Jose; William C. Plants, Santa Clara; Sinan Kaptanoglu, San Carlos; Runip Gopisetty, Los Gatos; King W. Chan, Los Altos; Marko Chew, Cupertino, all of Calif.

[73] Assignee: Actel Corporation, Sunnyvale, Calif.

[*] Notice: The term of this patent shall not extend beyond the expiration date of Pat. No. 5,477,165.

[21] Appl. No.: 746,554

[22] Filed: Nov. 13, 1996

Related U.S. Application Data

[63] Continuation of Ser. No. 522,945, Sep. 1, 1995, Pat. No. 5,606,267, which is a continuation of Ser. No. 332,550, Oct. 28, 1994, Pat. No. 5,477,165, which is a continuation-in-part of Ser. No. 246,218, May 19, 1994, Pat. No. 5,451,887, which is a continuation-in-part of Ser. No. 2,873, Jan. 13, 1993, Pat. No. 5,367,208, which is a continuation of Ser. No. 869,488, Apr. 15, 1992, Pat. No. 5,187,393, which is a continuation of Ser. No. 621,452, Jan. 15, 1991, Pat. No. 5,172,014, which is a division of Ser. No. 309,306, Feb. 10, 1989, Pat. No. 5,015,885, which is a continuation-in-part of Ser. No. 195,728, May 18, 1988, Pat. No. 4,873,459, which is a continuation-in-part of Ser. No. 909,261, Sep. 19, 1986, Pat. No. 4,758,745.

[51] Int. Cl.[6] .................................................. H03K 19/177
[52] U.S. Cl. ................................ 326/41; 326/39; 326/47
[58] Field of Search .............................. 326/34–41, 46–47

[56] References Cited

U.S. PATENT DOCUMENTS

| | | | |
|---|---|---|---|
| 3,619,583 | 11/1971 | Arnold | 235/152 |
| 3,731,073 | 5/1973 | Moylan | 235/152 |
| 3,816,725 | 6/1974 | Greer | 235/152 |
| 3,818,452 | 6/1974 | Greer | 340/166 |

(List continued on next page.)

FOREIGN PATENT DOCUMENTS

| | | | |
|---|---|---|---|
| 0 394 575 | 10/1990 | European Pat. Off. | H03K 19/177 |
| 0 515 043 | 11/1992 | European Pat. Off. | H03K 19/177 |
| 0 690 579 | 1/1996 | European Pat. Off. | H03K 19/173 |
| 57-111044 | 7/1982 | Japan | H01L 21/82 |
| 5-040804 | 11/1991 | Japan | G06F 15/60 |
| 6-506098 | 7/1994 | Japan | H03K 19/177 |
| 2 045 488 | 10/1980 | United Kingdom | H03K 19/20 |
| WO87/02827 | 5/1987 | WIPO | H01L 27/24 |

OTHER PUBLICATIONS

Akers, "A Rectangle Logic Array", Aug., 1972, IEEE Transaction on Computers, vol. C–21, No. 8, pp. 842–857.

Chen, "A Comparsion of Universal–Logic–Module Realizations and Their Application in the Synthesis of Combinatorial and Sequential Logic Networks", Feb. 1982, IEEE Transactions on Computers, vol. C–31, No. 2, pp. 140–147.

Greer, "An Associate Logic Matrix", Oct. 1976, IEEE, Journal of Solid–State Circuits, vol. SC–11, No. 5, pp. 679–691.

(List continued on next page.)

*Primary Examiner*—David R. Hudspeth
*Attorney, Agent, or Firm*—D'Alessandro & Ritchie

[57] ABSTRACT

A user-programmable gate array architecture includes an array of logic function modules which may comprise one or more combinatorial and/or sequential logic circuits. An interconnect architecture comprising a plurality of horizontal and vertical general interconnect channels, each including a plurality of interconnect conductors some of which may be segmented, is imposed on the array. Individual ones of the interconnect conductors are connectable to each other and to the inputs and outputs of the logic function modules by user-programmable interconnect elements. A local interconnect architecture comprising local interconnect channels is also imposed on the array. Each local interconnect channel includes a plurality of local interconnect conductors and runs between pairs of adjacent ones of the logic function modules.

31 Claims, 10 Drawing Sheets

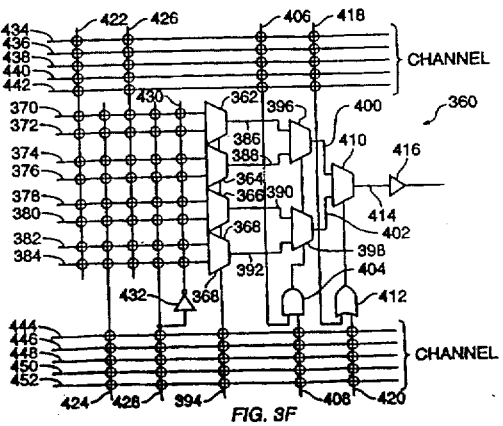

FIG. 3F

UNITED STATES PATENT AND TRADEMARK OFFICE
CERTIFICATE OF CORRECTION

PATENT NO. : 5,698,992
DATED : December 16 1997
INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

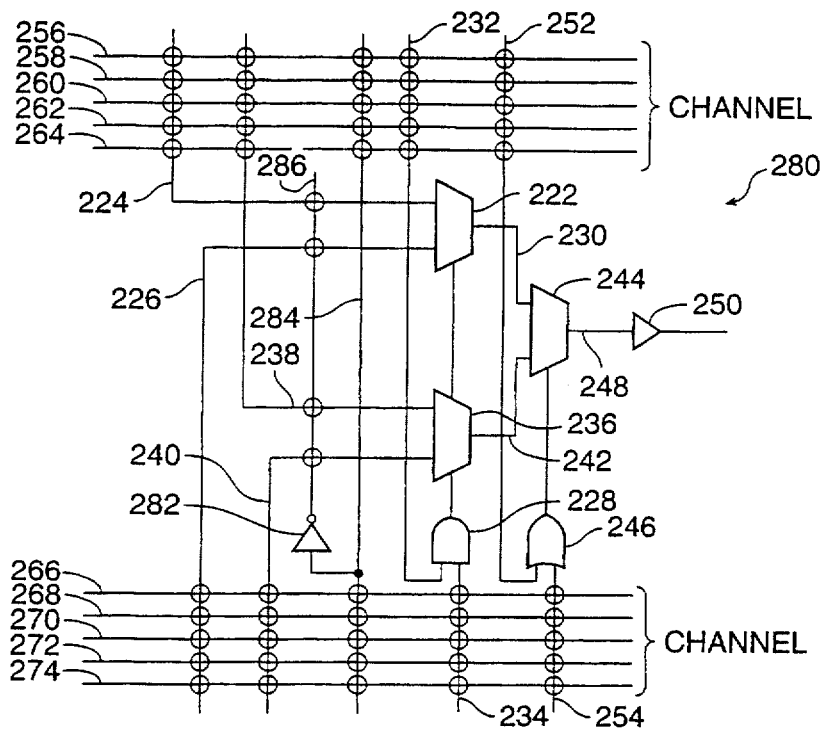

FIG. 3C

UNITED STATES PATENT AND TRADEMARK OFFICE
CERTIFICATE OF CORRECTION

Page 4 of 9

PATENT NO. : 5,698,992

DATED : December 16, 1997

INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

Please replace the existing FIG. 3F with the following corrected FIG. 3F:

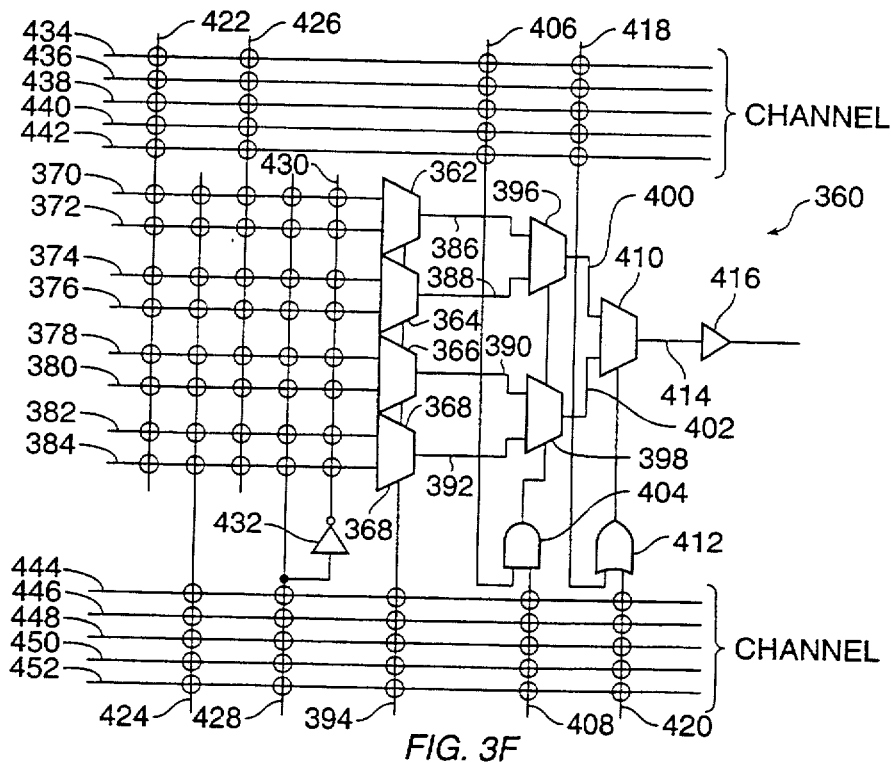

FIG. 3F

UNITED STATES PATENT AND TRADEMARK OFFICE
CERTIFICATE OF CORRECTION

PATENT NO. : 5,698,992
DATED : December 16, 1997
INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

Please replace the existing FIG. 3G with the following corrected FIG. 3G:

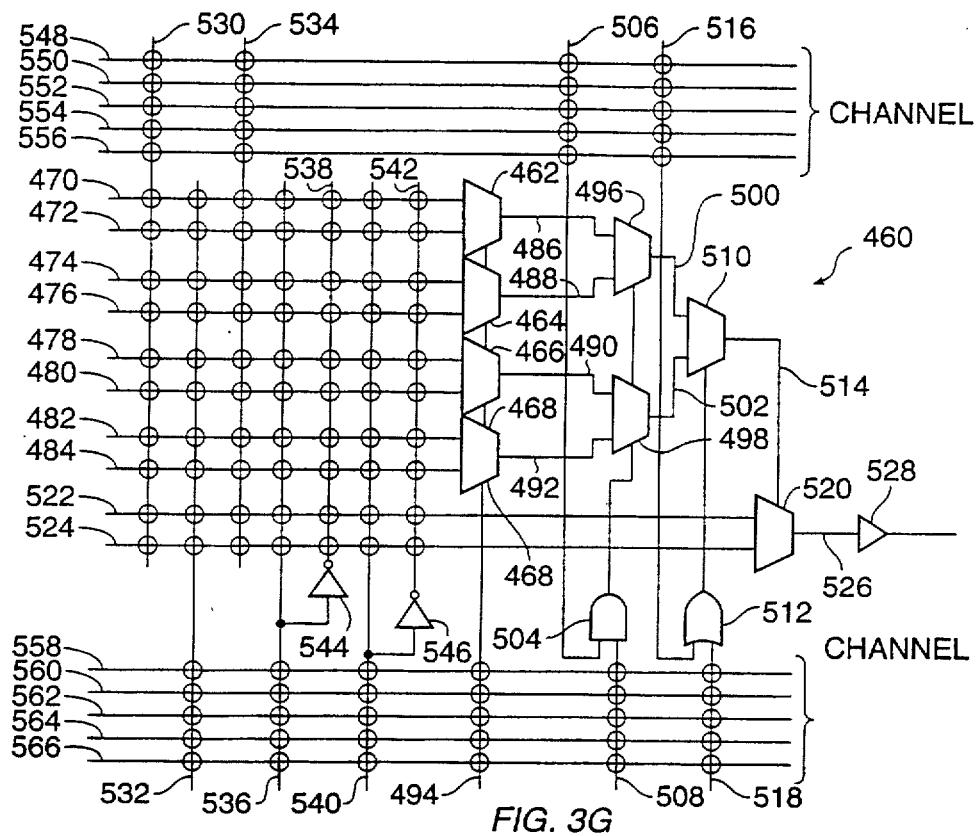

FIG. 3G

UNITED STATES PATENT AND TRADEMARK OFFICE
CERTIFICATE OF CORRECTION

PATENT NO. : 5,698,992

DATED : December 16, 1997

INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

Please replace the existing FIG. 3H with the following corrected FIG. 3H:

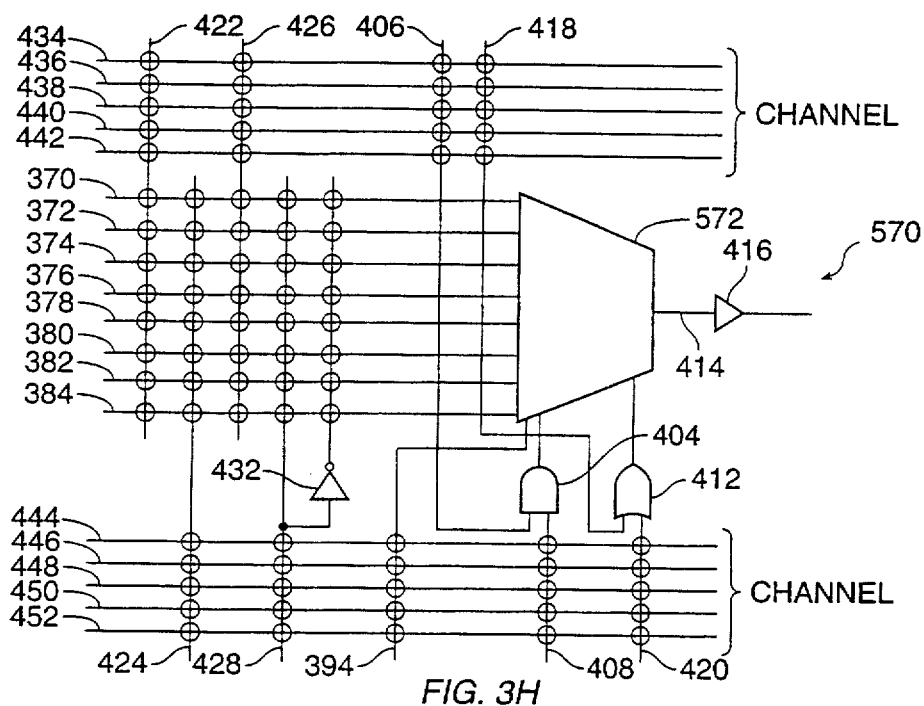

FIG. 3H

UNITED STATES PATENT AND TRADEMARK OFFICE
CERTIFICATE OF CORRECTION

PATENT NO. : 5,698,992
DATED : December 16, 1997
INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

In the specification:

Column 2, line 10: delete " : ".

Column 2, line 13: delete "army".

Column 3, line 48: replace "connected to inverter output" with --connected to an inverter output which--.

Column 4, line 61: replace "inputs nodes" with --input nodes--.

Column 5, line 56: replace "conductors another" with --conductors to another--.

Column 6, line 19: replace "Which" with --which--.

Column 6, line 21: replace "user" with --User--.

Column 6, line 52: replace "an" with --a--.

Column 7, line 12: replace "ad" with --art--.

Column 8, line 54: replace "12-22" with --12-12--.

Column 10, line 25: delete "a".

UNITED STATES PATENT AND TRADEMARK OFFICE
CERTIFICATE OF CORRECTION

PATENT NO. : 5,698,992
DATED : December 16, 1997
INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

Column 11, line 4: replace "IL4" with --!L4--.
Column 11, line 33: delete "node 60 to first input".
Column 13, line 27: replace "will" with --art will--.
Column 13, line 39: replace "288" with --238--.
Column 13, line 56: delete "a".
Column 14, line 14: replace "the" with --the art--.
Column 14, line 32: replace "the" with --the art--.
Column 15, line 15: replace "the" with --the art--.
Column 15, line 30: replace "eighth data inputs" with --eighth data input--.
Column 15, line 67: replace "the" with --the art--.
Column 16, line 34: replace "the" with --the art--.
Column 16, line 41: replace "eighth data inputs" with --eighth data input--.
Column 16, line 65: delete "a".
Column 17, line 16: replace "the" with --the art--.

UNITED STATES PATENT AND TRADEMARK OFFICE
CERTIFICATE OF CORRECTION

PATENT NO. : 5,698,992
DATED : December 16, 1997
INVENTOR(S) : Khaled El-Ayat, Greg Bakker, Jung-Cheun Lien, William C. Plants, Sinan Kaptanoglu, Runip Gopisetty, King W. Chan, Marko Chew It is certified that error appears in the above-identified patent and that said Letters Patent is hereby corrected as shown below:

Column 17, line 23: delete "a".
Column 17, line 34: replace "504" --494--.
Column 17, line 40: replace "will appreciate" with --art will appreciate--.
Column 19, line 19: replace "function" with --functions--.
Column 20, line 41: replace "logic module" with --the logic module--.
Column 20, line 44: replace "logic module" with --the logic module--.
Column 20, line 34: replace ".710" with --710--.

Signed and Sealed this

Fifteenth Day of June, 1999

Attest:

Q. TODD DICKINSON

*Attesting Officer*   Acting Commissioner of Patents and Trademarks